United States Patent
Chu et al.

(10) Patent No.: US 12,385,850 B2
(45) Date of Patent: Aug. 12, 2025

(54) SEMICONDUCTOR WAFERS USING FRONT-END PROCESSED WAFER GLOBAL GEOMETRY METRICS

(71) Applicant: GlobalWafers Co., Ltd., Hsinchu (TW)

(72) Inventors: Yung Hsing Chu, Zhubei (TW); Yen-Chun Chou, Taoyuan (TW); Shan-Hui Lin, Hsinchu (TW)

(73) Assignee: GlobalWafers Co., Ltd., Hsinchu (TW)

( * ) Notice: Subject to any disclaimer, the term of this patent is extended or adjusted under 35 U.S.C. 154(b) by 572 days.

(21) Appl. No.: 17/818,123

(22) Filed: Aug. 8, 2022

(65) Prior Publication Data

US 2023/0050442 A1 Feb. 16, 2023

Related U.S. Application Data

(60) Provisional application No. 63/260,295, filed on Aug. 16, 2021.

(51) Int. Cl.
*G01N 21/88* (2006.01)
*B24B 9/06* (2006.01)
(Continued)

(52) U.S. Cl.
CPC ......... *G01N 21/8851* (2013.01); *B24B 9/065* (2013.01); *H01L 21/304* (2013.01); *H01L 21/67092* (2013.01); *H01L 21/67288* (2013.01); *H01L 22/12* (2013.01); *G01N 2021/8861* (2013.01)

(58) Field of Classification Search
CPC ........ G01N 21/8851; G01N 2021/8861; B24B 9/065; H01L 21/304; H01L 21/67092; H01L 21/67288; H01L 22/12; H01L 22/20
See application file for complete search history.

(56) References Cited

U.S. PATENT DOCUMENTS 8,898,599 B2   11/2014   Liu et al.
10,024,654 B2   7/2018   Smith et al.
(Continued)

FOREIGN PATENT DOCUMENTS

EP   3117454 B1   6/2020
KR   2019134168 A * 12/2019 ......... G01N 21/8851

OTHER PUBLICATIONS

International Search Report and Written Opinion issued for Application No. PCT/US2022/039785, dated Dec. 12, 2022 (17 pages).

*Primary Examiner* — John P. Dulka
(74) *Attorney, Agent, or Firm* — Armstrong Teasdale LLP

(57) ABSTRACT

A method for processing semiconductor wafers includes obtaining measurement data from a surface of a semiconductor wafer processed by a front-end process tool. The method includes determining a center plane of the wafer based on the measurement data, generating raw shape profiles, and generating ideal shape profiles. The method further includes generating Gapi profiles based on the raw shape profiles and the ideal shape profiles, and calculating a Gapi value of the semiconductor wafer based on the Gapi profiles. The generated Gapi profiles and/or the calculated Gapi value may be used to tune the front-end process tool and/or sort the semiconductor wafer for polishing. Systems include at least a front-end process tool, a flatness measurement tool, and a computing device.

20 Claims, 17 Drawing Sheets

(51) Int. Cl.
    *H01L 21/304*     (2006.01)
    *H01L 21/66*     (2006.01)
    *H01L 21/67*     (2006.01)

(56) References Cited

U.S. PATENT DOCUMENTS

| | | |
|---|---|---|
| 10,025,894 B2 | 7/2018 | Vukkadala et al. |
| 10,401,279 B2 | 9/2019 | Vukkadala et al. |
| 2012/0129431 A1 | 5/2012 | Hui et al. |
| 2014/0078495 A1 | 3/2014 | Zhang |
| 2016/0126150 A1 | 5/2016 | Goldberg |
| 2023/0047412 A1* | 2/2023 | Chu ........................ H01L 22/20 |

* cited by examiner

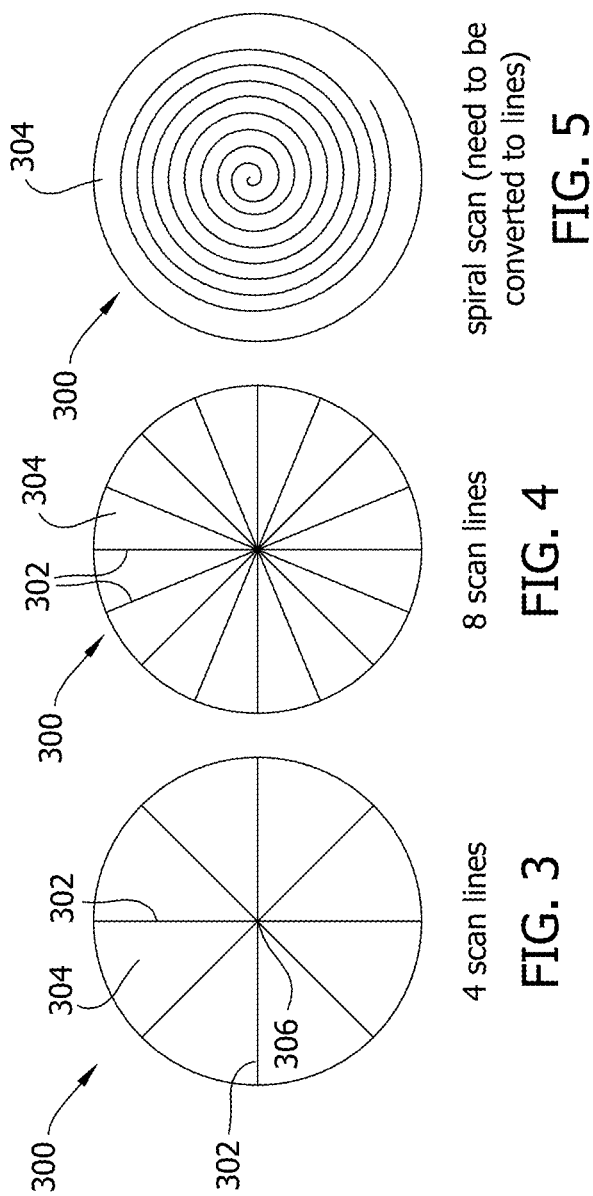

SEMICONDUCTOR WAFERS USING FRONT-END PROCESSED WAFER GLOBAL GEOMETRY METRICS

CROSS-REFERENCE TO RELATED APPLICATION

This application claims priority to U.S. Provisional Patent Application No. 63/260,295, filed Aug. 16, 2021, the disclosure of which is hereby incorporated by reference in its entirety.

FIELD

This disclosure relates generally to processing of semiconductor wafers and, more particularly, to systems and methods for processing semiconductor wafers using front-end processed wafer geometry metrics.

BACKGROUND

Semiconductor wafers are commonly used in the production of integrated circuit (IC) chips on which circuitry are printed. The circuitry is printed as identical integrated circuits ("die") in miniaturized form onto surfaces of the wafers in a multi-stage fabrication process. Specifically, the process includes various stages of electron beam-lithographic or photolithographic processing steps ("lithography") and chemical or physical processing steps (e.g., chemical mechanical polishing, etching, and passivation). At each stage, a new pattern layer is added to the surface of the wafer, or an existing layer is modified. Precise alignment of the layers ("overlay") is critical for end performance of the chips.

Chip manufacturers require wafers that have extremely flat and parallel surfaces to mitigate or eliminate overlay error and ensure that a maximum number of chips can be fabricated from each wafer. Wafers are initially obtained from a single crystal ingot of suitable material (e.g., silicon). Wafers may be sliced from the ingot using, for example, a wire saw. The surfaces of the raw wafers are then subject to preliminary flattening and etching using additional front-end process tools, such as a grinding, lapping, or etching tool. The edges may also be grinded and/or rounded using a beveling tool. The surfaces are then polished to produce a smooth, highly reflective, mirrored wafer surface.

Conventional metrology tools may be used to determine whether the surface(s) of the polished wafer meet geometry (e.g., shape and/or flatness) specifications before lithography. Shape is the long wavelength component of the wafer geometry in an unchucked state, defined as the deviation of median surface of the wafer relative to a best-fit median surface reference plane. It can be characterized by global parameters such as warp, the sum of the maximum positive and negative deviations from the best-fit plane, and bow, the distance between the surface and the best-fit plane at a center of the wafer. Flatness is the variation of wafer thickness relative to the reference plane. It can be characterized by global parameters, such as the maximum variation of wafer thickness from an ideal flat back surface (GBIR), or local parameters, such as site flatness, front reference surface, least squares reference plane, range (SFQR).

For existing wafer metrics, these measurements are only sufficient to predict overlay errors early on in the fabrication process (e.g., between the first patterned layers). As more layers are formed on the wafer, elastic deformation may occur resulting in changes in the wafer shape. Overlay errors can be characterized by in-plane distortion and out-of-plane distortion of the wafer. Patterned Wafer Geometry metrology systems (such as those manufactured by KLA-Tencor Corporation) may be used to measure these distortions between patterning steps and provide wafer metrics to account for overlay errors. However, these existing systems use high accuracy inspection tools that require a polished surface, and take measurements after at least part of the fabrication process has begun. No solutions exist to provide a pre-fabrication wafer distortion prediction index using flatness inspection measurements of a front-end processed wafer.

This Background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

In one aspect, a method for processing semiconductor wafers includes providing a first semiconductor wafer processed by a front-end process tool and obtaining measurement data from scan lines along a surface of the first semiconductor wafer. The measurement data of each scan line includes a thickness profile and a surface profile. The method also includes determining a center plane of the wafer based on the measurement data of the scan lines, generating, for each scan line, a raw shape profile based on the measurement data of the scan line and the center plane of the wafer, and generating, for each scan line, an ideal shape profile based on polynomial regression of the raw shape profile. The method further includes generating, for each scan line, a Gapi profile based on the raw shape profile and the ideal shape profile, and calculating a Gapi value of the first semiconductor wafer based on the Gapi profiles of the scan lines. The method also includes determining whether the Gapi value of the first semiconductor wafer is within a predetermined threshold. If the Gapi value of the first semiconductor wafer is not within the predetermined threshold, the method includes tuning the front-end process tool based on at least one of the Gapi profiles of the scan lines of the first semiconductor wafer, and processing a second semiconductor wafer with the tuned front-end process tool. If the Gapi value of the first semiconductor wafer is within the predetermined threshold, the method includes sorting the first semiconductor wafer for polishing.

In another aspect, a system for processing semiconductor wafers includes a front-end process tool for front-end processing of a semiconductor wafer and a flatness inspection tool for obtaining measurement data from scan lines along a surface of the front-end processed wafer. The measurement data of each scan line includes a thickness profile and a surface profile. The system also includes a computing device connected to the flatness inspection tool and the front-end process tool. The computing device is configured to receive the measurement data of the scan lines from the flatness inspection tool, determine a center plane of the wafer based on the measurement data of the scan lines, generate, for each scan line, a raw shape profile based on the measurement data of the scan line and the center plane of the wafer, and generate, for each scan line, an ideal shape profile based on polynomial regression of the raw shape profile. The computing device is also configured to generate, for each scan line, a Gapi profile based on the raw shape profile and the ideal shape profile, calculate a Gapi value of the front-end processed wafer based on the Gapi profiles of the scan lines, and determine whether the Gapi value of the front-end processed wafer is within a predetermined threshold. If the Gapi value of the front-end processed wafer is not within the predetermined threshold, the computing device is configured to modify the front-end process tool based on at least one of the Gapi profiles of the scan lines.

In yet another aspect, a method for processing semiconductor wafers includes providing a first semiconductor wafer processed by a front-end process tool and obtaining measurement data of an edge profile of the first semiconductor wafer. The method also includes determining an edge profile center point based on the measurement data, generating a raw height profile based on the measurement data and the edge profile center point, and generating an ideal edge profile based on polynomial regression of the raw height profile. The method further includes generating a Gapi edge profile of the first semiconductor wafer based on the raw height profile and the ideal edge profile, calculating a Gapi edge value of the first semiconductor wafer based on the Gapi edge profile, and determining whether the Gapi edge value of the first semiconductor wafer is within a predetermined threshold. If the Gapi edge value of the first semiconductor wafer is not within the predetermined threshold, the method includes tuning the front-end process tool based on the Gapi edge profile of the first semiconductor wafer, and processing a second semiconductor wafer with the tuned front-end process tool. If the Gapi edge value of the first semiconductor wafer is within the predetermined threshold, the method includes sorting the first semiconductor wafer for polishing.

In yet another aspect, a system for processing semiconductor wafers includes a front-end process tool for front-end processing of a semiconductor wafer and a flatness inspection tool for obtaining measurement data of an edge profile of the front-end processed wafer. The system also includes a computing device connected to the flatness inspection tool and the front-end process tool. The computing device is configured to receive the measurement data from the flatness inspection tool, determine an edge profile center point based on the measurement data, generate a raw height profile based on the measurement data and the edge profile center point, and generate an ideal edge profile based on polynomial regression of the raw height profile. The computing device is also configured to generate a Gapi edge profile of the front-end processed wafer based on the raw height profile and the ideal edge profile, calculate a Gapi edge value of the front-end processed wafer based on the Gapi edge profile, and determine whether the Gapi edge value of the front-end processed wafer is within a predetermined threshold. If the Gapi edge value of the front-end processed wafer is not within the predetermined threshold, the computing device is configured to modify the front-end process tool based on the Gapi edge profile of the front-end processed wafer.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated embodiments may be incorporated into any of the above-described aspects, alone or in any combination.

BRIEF DESCRIPTION OF THE DRAWINGS

FIG. 3 is a schematic illustration of four scan lines on a front-end processed wafer surface used to obtain front-end processed wafer geometry measurement data by a geometry measurement tool.

FIG. 4 is a schematic illustration of eight scan lines on a front-end processed wafer surface used to obtain front-end processed wafer geometry measurement data by a geometry measurement tool.

FIG. 5 is a schematic illustration of a spiral scan on a front-end processed wafer surface used to obtain front-end processed wafer geometry measurement data by a geometry measurement tool.

DETAILED DESCRIPTION

Example systems and methods use a Gapi wafer geometry metric generated and/or calculated from measurement data of a semiconductor wafer. Generally, and in embodiments of the present disclosure, suitable semiconductor wafers (which may also be referred to as "wafers" or "silicon wafers") include single crystal silicon wafers, such as, for example, substrate wafers obtained by slicing the wafers from ingots formed by the Czochralski method or the float zone method. Each semiconductor wafer includes a central axis, a front surface, and a back surface parallel to the front surface. The front and back surfaces are generally perpendicular to the central axis. A circumferential edge joins the front and back surfaces. The semiconductor wafers may be any diameter suitable for use by those of skill in the art including, for example, 200 mm, 300 mm, greater than 300 mm or even 450 mm diameter wafers.

The Gapi metric may be used as an in-plane distortion (IPD) prediction index and may be used to sort semiconductor wafers based on a correlation between the predicted in-plane distortion and expected back-end yield. The Gapi metric may suitably be generated and/or calculated from measurement data of a front-end processed semiconductor wafer, but may be used in other applications. The Gapi metric may be utilized to adjust a front-end process tool and otherwise sort wafers that have an acceptable Gapi metric for further processing.

Figure 1:
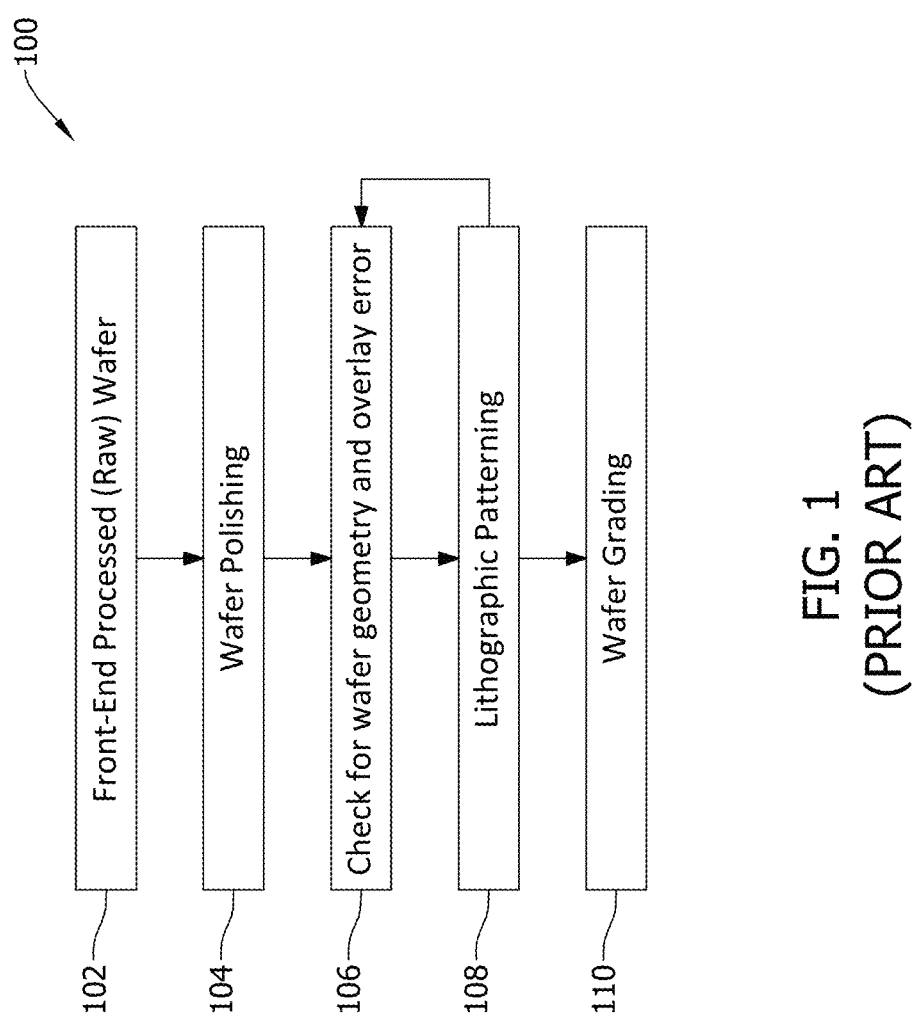
FIG. 1 is a process flow of a method for processing a wafer using a polished wafer geometry metric.

FIG. 1 shows a conventional general process flow 100 for processing semiconductor wafers. At step 102, a front-end processed wafer is provided for further processing. As used herein, "front-end processed" is a wafer that has been processed by a front-end process tool, including for example, a wafer sliced from a single crystal ingot of semiconductor material (e.g., silicon). The front-end processed wafer may also have had one or both surfaces etched, lapped or grinded, and/or have had the edges rounded. Examples of front-end process tools include wire saws, lapping tools, grinding tools, beveling tools, and etching tools.

The surface condition of front-end processed wafers provided by step 102 is still relatively rough and generally not suitable for lithographic processing, which requires a particularly flat surface. At step 104, the front-end processed wafer is polished. The polishing operation at step 104 may be an intermediate polishing operation and/or a finish polishing operation. In an intermediate polishing operation, the front surface of the front-end processed wafer is polished to improve flatness and remove handling scratches. In a finish polishing operation, the front surface of the wafer is finish polished to remove fine or "micro" scratches from the front surface and to produce a highly-reflective, damage-free front surface of the wafer. As used herein, "in-process" is a wafer that has a front surface that has been intermediate and/or finish polished and, optionally, has undergone one or more patterning processing steps as described below. After the polishing at step 104, and optionally after additional patterning processing steps, a high accuracy inspection tool (e.g., a WaferSight™ 2 or 2+ bare wafer geometry metrology system manufactured by KLA-Tencor Corporation) may be used to determine the shape and flatness of the in-process wafer, as well as other parameters such as nanotopography. From these measurements, conventional metrics may be used at step 106 to predict overlay errors for at least the first patterning step.

At step 108, a series of patterning processing steps involving lithography and other chemical and/or mechanical processing (e.g., chemical mechanical polishing, etching, passivation, diffusion, etc.) are carried out to form integrated circuit(s) ("die") on the wafer. Various layers which may include, for example, photo-masked resist patterns, oxide layers, and metal layers, are deposited on the wafer. Each layer formed on the surface may have non-uniform, intrinsic stress, resulting in elastic deformation (e.g., IPD) of the wafer shape. To mitigate the effect of overlay errors on product yield, steps 106 and 108 may be repeated in sequence, whereby in-process overlay errors are corrected by adjusting the lithographic tool. However, as design rules continue to shrink for lithographic patterns (such as below 10 nm), in-process control of overlay becomes more difficult. Non-correctable overlay errors occur where no corrective action can be taken by the lithographic tool. As a result, low back-end yield of quality wafers is realized at wafer grading step 110.

Figure 2:
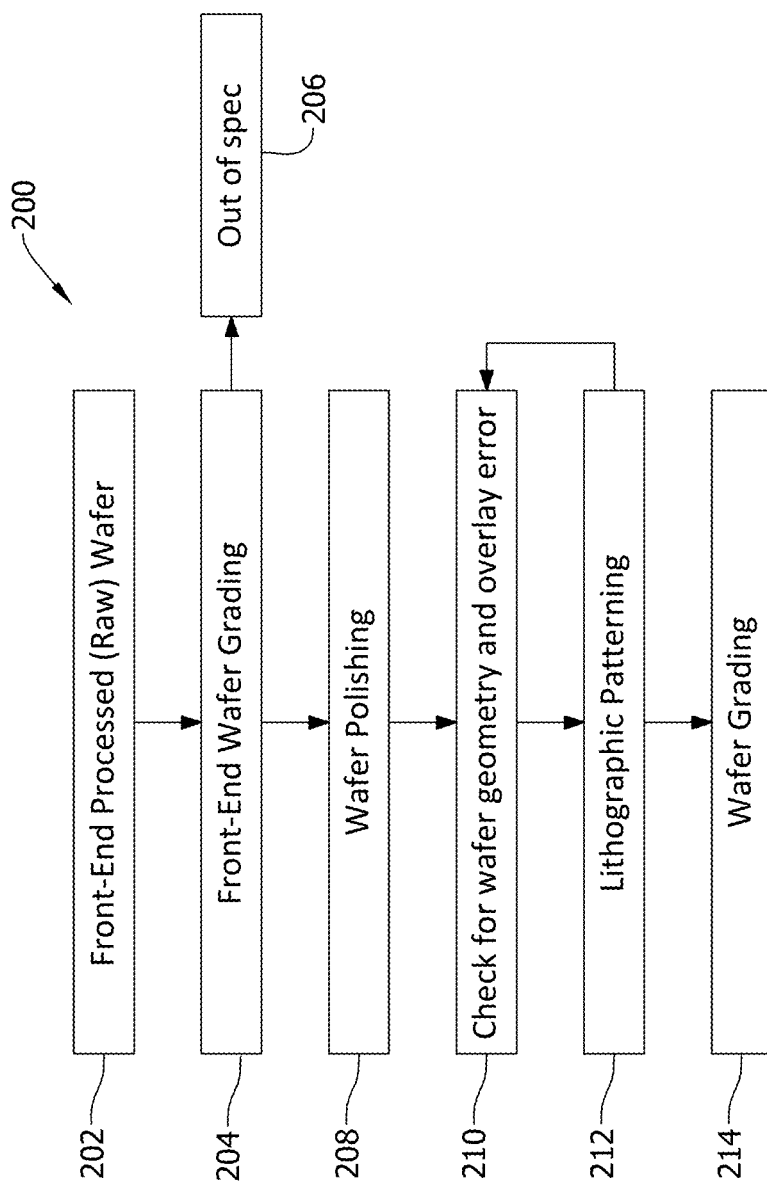
FIG. 2 is a process flow of a method for processing a wafer using a front-end processed wafer geometry metric in accordance with the present disclosure.

With reference to FIG. 2, an example general process flow 200 for processing semiconductor wafers with improved overlay and process control is shown. A wafer is provided at step 202 similar to step 102 discussed above in process 100. An additional process step 204 is included in process 200 where grading of the front-end processed wafer is performed before further processing and/or fabrication of the wafer. For example, the front-end wafer grading step 204 may take place before a wafer polishing step 208 and/or before patterning and layer formation step 212. At step 204, a wafer metric, such as a Gapi metric as discussed in more detail herein, is determined based on the shape and/or flatness of the front-end processed wafer. The wafer is then sorted at step 206 based on this metric. For example, the wafer may be determined to be outside a desired specification based on the metric and is discarded or identified for further front-end processing at step 206. If the wafer is determined to meet a desired specification, the wafer may be further processed starting, for example, at polishing step 208. The desired specification may be, for example, a tolerance level of predicted IPD during wafer processing based on a correlated back-end yield.

One advantage of process 200 is that the wafer grading takes place before certain irreversible processing steps occur. Out of specification wafers sorted at step 206 may be salvaged by further processing using front-end tools to bring the wafer metric within the desired specification. For example, lapping or grinding processes may be repeated to adjust the shape and/or flatness of the wafer. Additionally, by identifying out of specification wafers early on in wafer processing, an improved back-end yield of processed wafers at wafer grading step 214 can be achieved. This increases the amount of quality grade dies that are eventually formed, and cuts costs associated with non-correctable overlay errors that occur during manufacturing. Also, because the wafers that are further processed have been vetted for predicted IPD, the need for in-process overlay control may be reduced or eliminated. In this regard, more efficient sequencing between overlay control at step 210 and wafer patterning at step 212 can be realized.

Figure 7A:
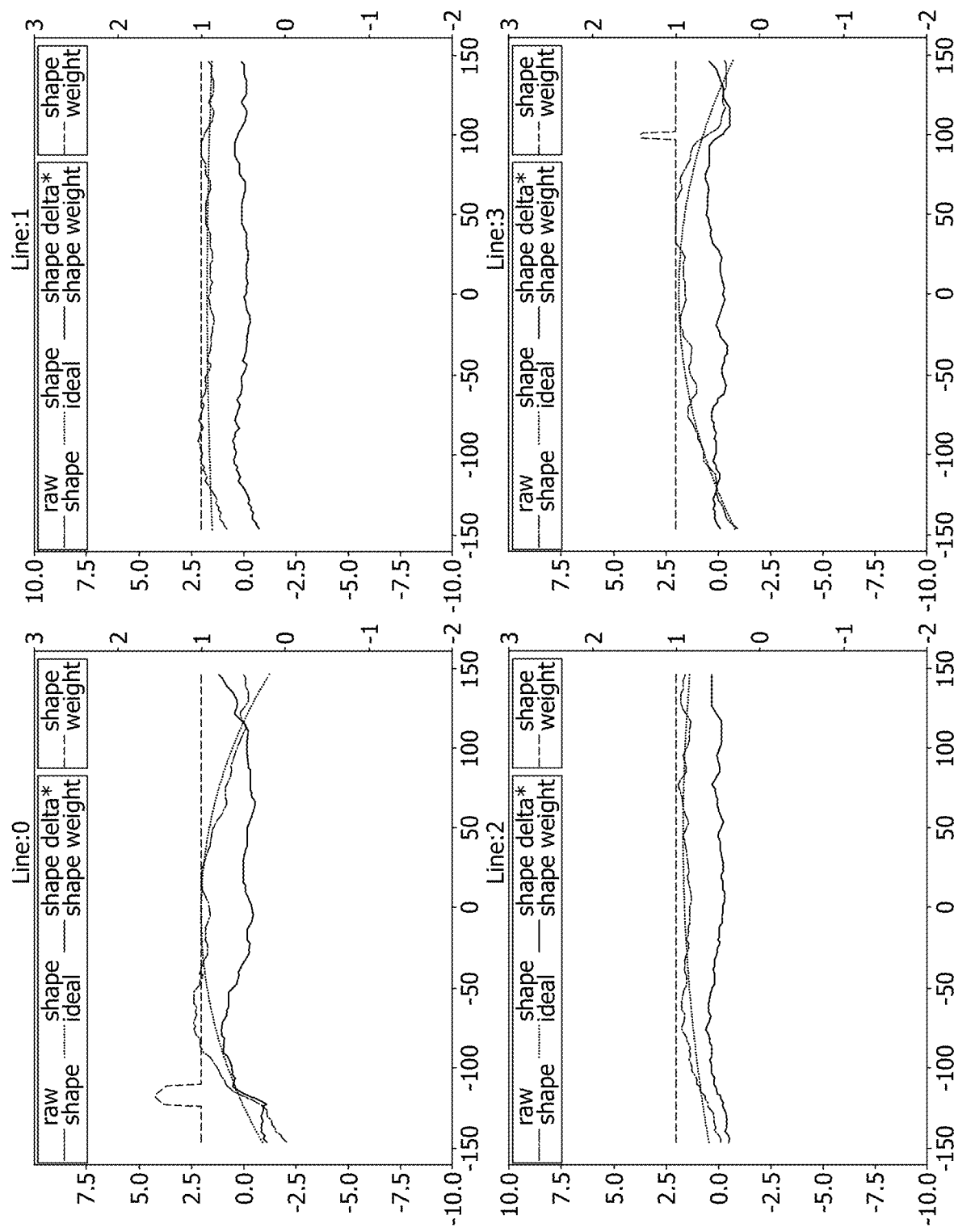
FIGS. 7a and 7b are a set of plots generated using the measurement data obtained by the geometry measurement tool and wafer surface scans of FIGS. 3-5.
Figure 7B:
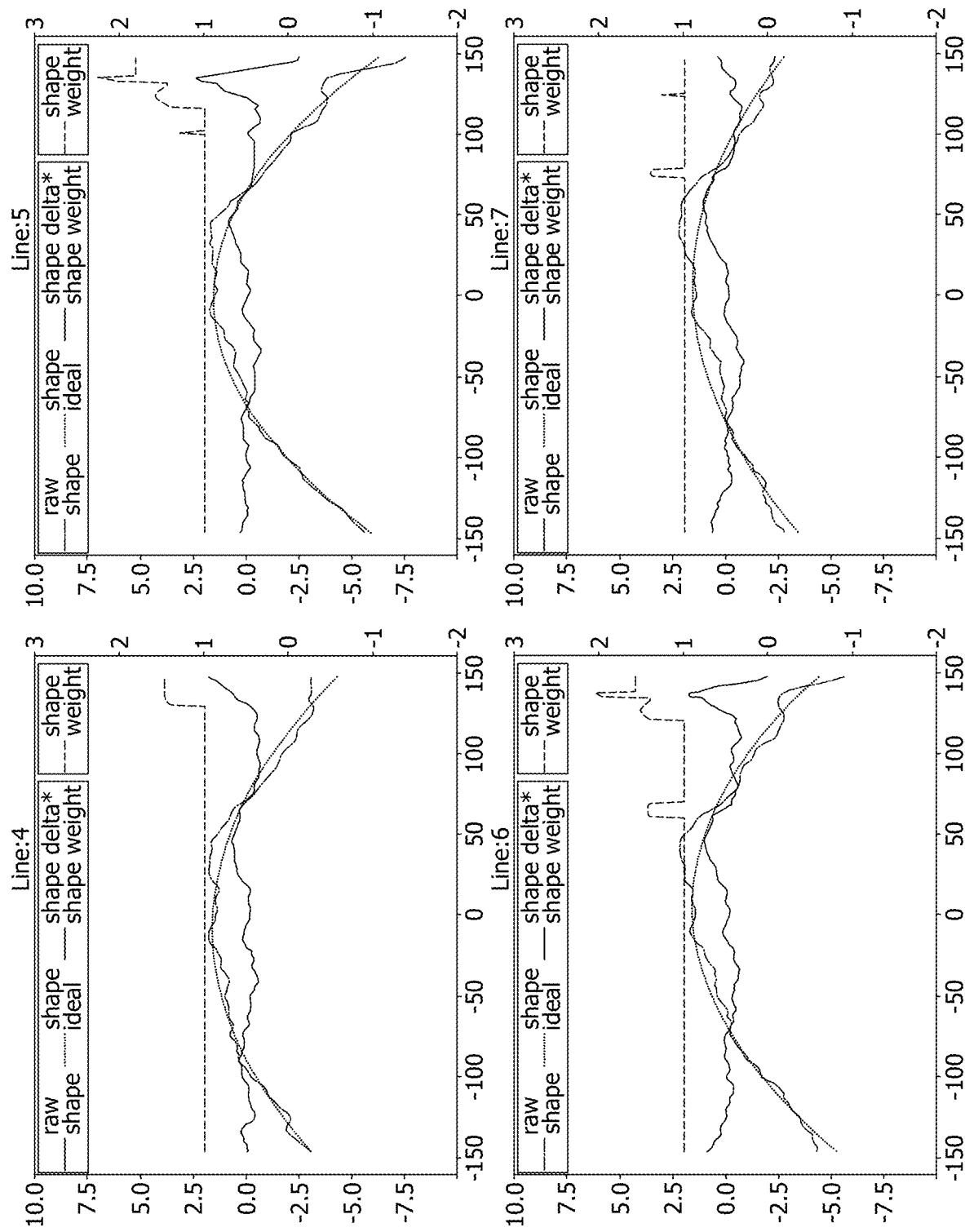
Figure 8:
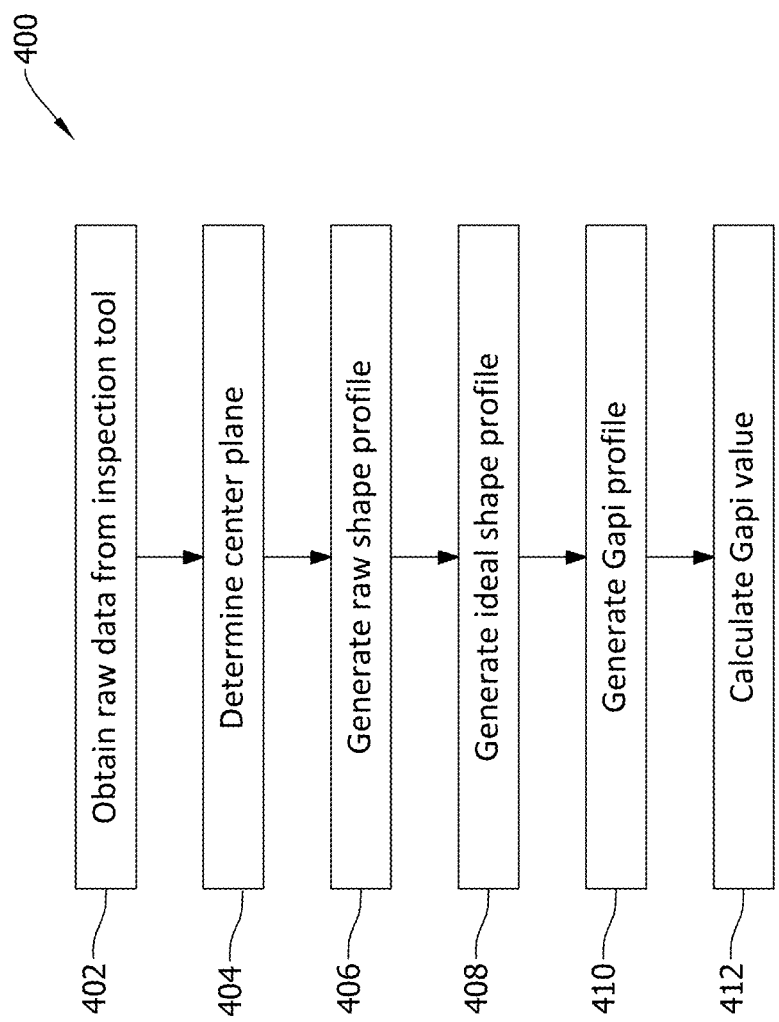
FIG. 8 is a process flow of a method for calculating a Gapi value of a front-end processed wafer in accordance with the present disclosure.

With reference to FIGS. 3-8, an example method for determining a Gapi metric for a front-end processed wafer 300 is described. FIG. 8 shows a process flow 400 for determining the Gapi metric. At step 402, a geometry measurement tool (also referred to herein as a flatness inspection tool) is used to obtain measurement data from the front-end processed wafer 300 (shown in FIGS. 3-6). Examples of suitable geometry measurement tools include Kobelco SBW series tools, Kobelco LGW series tools, and Kobelco LSW series tools. The geometry measurement tool suitably obtains measurement data of one or both surfaces that includes the surface height and the thickness of points along one or both surfaces of the wafer 300 using a capacitance probe or interferometer. In one example, the geometry measurement tool is a Kobelco SBW-330 tool.

As shown in FIGS. 3-5, the geometry measurement tool may obtain measurement data by scanning along diameter lines 302 (also referred herein to as scan lines 302 or scanned diameter lines 302) extending across a surface 304 (e.g., a front surface) of the wafer 300 (FIGS. 3 and 4) or by a spiral scan (FIG. 5) of the surface 304 the wafer 300. The geometry measurement tool may obtain measurement data by scanning along two or more diameter lines 302, such as 4 diameter lines 302 (shown in FIG. 3) or 8 diameter lines 302 (shown in FIG. 4). The measured wafer 300 may be in an unchucked (i.e., free-standing) state.

The measurement data obtained by the geometry measurement tool includes surface profiles of the wafer 300. Each surface profile is obtained along a scanned diameter line 302 by measuring a surface height at points on the surface 304 (shown in FIG. 6) that are positioned along the respective scanned diameter line 302. For example, each surface profile may include surface heights measured at more than 100, more than 200, or more than 290 points along a respective diameter line 302. Each point has a position along the diameter line 302 extending across the surface 304, measured as a distance (in millimeters, mm) from a center 306 of the surface 304. The surface height measured at each point may be represented as $H_n(x)$, where n identifies the scanned diameter line, and x is the relative distance (in mm) of the point from the center 306 of the wafer 300 measured along the scanned diameter line n. The surface height is determined as a distance from a reference height, $H_{ref}=0$. The surface profile obtained by scanning along each diameter line 302 includes the range of surface heights measured at the points along the respective diameter line 302. In one embodiment, surface profiles are obtained by scanning diameter lines 302 along only the surface 304 of the wafer 300 (e.g., a front surface). In other embodiments, surface profiles are obtained by scanning diameter lines 302 along both of the surface 304 and a surface 308 (shown in FIG. 6) of the wafer 300 (i.e., the front and back surfaces).

The measurement data obtained by the geometry measurement tool also includes thickness profiles of the wafer 300. Each thickness profile is obtained along a scanned diameter line 302 by measuring a thickness at the points along the respective scanned diameter line 302. The thickness at each point along each diameter line 302 is measured as the distance between the point and a corresponding point at the same position on the other surface 308 of the wafer 300. Thus, the thickness may be determined by the surface height $H_n(x)$ of the point on the surface 304 and a surface height of the corresponding point on the surface 308. The thickness at each point along a diameter line 302 may be represented as $T_n(x)$, where n identifies the scanned diameter line, and x is the relative distance (in mm) of the point from the center 306 of the wafer 300 measured along the scanned diameter line n. The thickness profile obtained by scanning along each diameter line 302 includes the range of thickness values measured at the points along the respective diameter line 302.

Referring back to FIG. 8, at step 404 a center plane CP (shown in FIG. 6) of the wafer 300 is determined based on the thickness profiles and the surface profiles obtained by scanning along the diameter lines 302. The center plane CP may be based on a thickness plane TP (shown in FIG. 6) of the wafer 300. The thickness plane TP is located between the front and back surfaces 304 and 308 of the wafer 300. In one example, the thickness plane TP is mapped as the surface height $H_n(x)$ plus one half the thickness $T_n(x)$ at each point along the scanned diameter lines 302. In this regard, the thickness plane TP may include points corresponding to the measured points of each of the scan lines 302 along the surface(s) 304 and 308 of the wafer 300. The center plane CP may then be determined based on regression analysis of the points along the thickness plane TP, such as by least squares best fit, moving average, or polynomial fit. In one example embodiment, the center plane CP is determined by least squares best fit of the points along the thickness plane TP.

Figure 6:
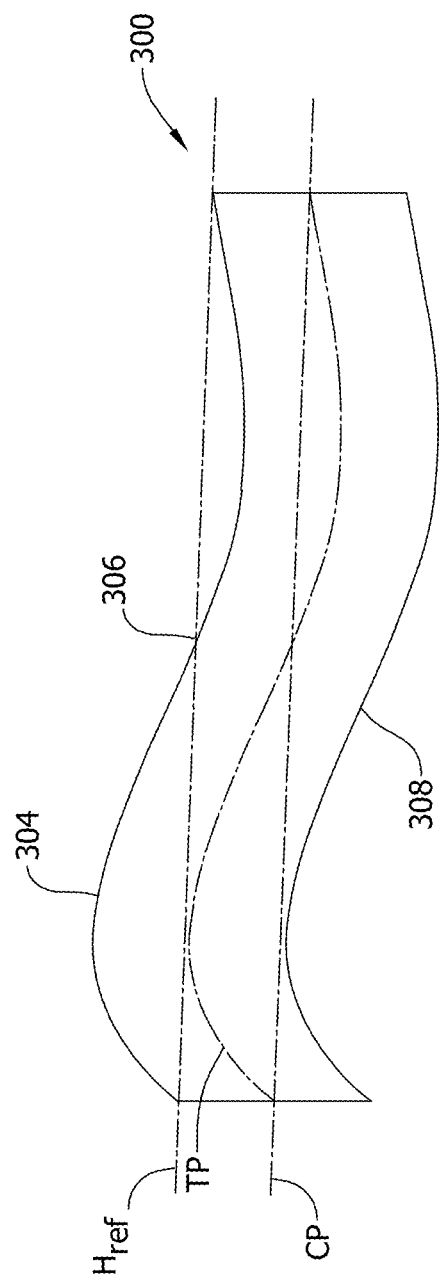
FIG. 6 is a schematic section of a front-end processed wafer.

FIG. 6 shows a schematic section view of the scanned front-end processed wafer 300, taken along one of the diameter lines 302, having the front surface 304 and back surface 308. Measurement data that includes surface profiles and thickness profiles of the wafer 300 may be obtained by measuring the surface height $H_n(x)$ and thickness $T_n(x)$ at points along scanned diameter lines 302 (shown in FIGS. 3 and 4) extending across the front surface 304 and, optionally, across the back surface 308. The thickness $T_n(x)$ at each point is the distance between the point on the front surface 304 and a corresponding point on the back surface 308. The thickness plane TP of the wafer 300 can be determined based on the surface height $H_n(x)$ and thickness $T_n(x)$ at each point. The center plane CP of the wafer 300 is determined by regression analysis of the points along the thickness plane TP, as described above. The view shown in FIG. 6 is for reference only and is not intended to be a to-scale depiction of the surface height or thickness at points on a measured wafer.

Referring again to FIG. 8, at step 406 a raw shape profile is generated for the wafer 300 along each scanned diameter line 302. Each raw shape profile is generated based on the obtained measurement data which includes the surface profile and the thickness profile along the respective scanned diameter line 302, and the determined center plane CP of the wafer 300. Each raw shape profile includes raw shape values calculated at each scanned point along the respective scanned diameter line 302. The raw shape may be calculated as a function of the surface height $H_n(x)$ and the thickness $T_n(x)$ at each point, and the height of a corresponding point at the same position on the center plane CP. In one example, the raw shape $RS_n$ is calculated at each point by the formula:

$$RS_n(x)=H_n(x)+0.5*(T_n(x)-CP_n(x))$$

where n identifies the scanned diameter line, x is the relative distance (in mm) of the point from the center 306 of the wafer 300 measured along the scanned diameter line n, $H_n(x)$ is the measured surface height of the point along scanned diameter line n at x, $T_n(x)$ is the measured thickness of the point along scanned diameter line n at x, and $CP_n(x)$ is the height of the point on the center plane corresponding to the point along the scanned diameter line n at x.

In some embodiments, the raw shape profile may be smoothed by moving average. For example, defined windows may be set in a direction along the respective scanned diameter line 302 for the raw shape profile. The windows may have a size less than 10 mm, less than 5 mm, or 3 mm. A moving average of the raw shapes at points within a window is calculated for each window. The raw shape for points within each window is then set as the calculated moving average for the window.

At step 408, an ideal shape profile is generated for the wafer 300 along each scanned diameter line 302. Each ideal shape profile may be generated based on polynomial regression of the raw shape profile generated for the respective scanned diameter line 302. In one example, each ideal shape profile is generated based on $2^{nd}$-order polynomial fitting of the raw shape values calculated at the points along the respective scanned diameter line 302. Each ideal shape profile includes ideal shape values calculated at each scanned point along the respective scanned diameter line 302. In one example, the ideal shape $IS_n$ is calculated at each point by the formula:

$$IS_n(x) = a*(RS_n(x))^2 + b*(RS_n(x)) + c$$

where n identifies the scanned diameter line, x is the relative distance (in mm) of the point from the center 306 of the wafer 300 measured along the scanned diameter line n, $RS_n(x)$ is the raw shape value generated for the scanned diameter line n at x, a and b are polynomial coefficients, and c is error determined by the polynomial fit analysis. The polynomial fit analysis is executed using, for example, NumPy in Python (i.e., np.polyfit curve fitting function).

At step 410, a Gapi profile is generated for the wafer 300 along each scanned diameter line 302. Each Gapi profile may be generated based on the ideal shape profile and the raw shape profile generated for the respective scanned diameter line 302. In one example, each Gapi profile is generated by generating a delta shape profile for the respective scanned diameter line 302. Each delta shape profile includes delta shape values calculated at the points along the respective scanned diameter line 302. Each delta shape may be calculated by comparing the ideal shape and the raw shape at each point along the respective scanned diameter line 302. In one example, the delta shape $DS_n$ is calculated at each point by the formula:

$$DS_n(x) = IS_n(x) - RS_n(x)$$

where n identifies the scanned diameter line, x is the relative distance (in mm) of the point from the center 306 of the wafer 300 measured along the scanned diameter line n, $RS_n(x)$ is the raw shape value generated for the scanned diameter line n at x, and $IS_n(x)$ is the ideal shape value generated for the scanned diameter line n at x. The delta shape profile is able to describe the wafer shape and flatness for each scanned diameter line 302 by quantifying deviations of each of the generated raw shape profiles from the respective ideal shape profiles. In some embodiments, each Gapi profile is generated based solely on the delta shape profile generated for the respective scanned diameter line 302.

Each Gapi profile may be based on the delta shape profile generated for the respective scanned diameter line 302 and weighting factors applied to the delta shape profile. The weighting factors may be applied (e.g., multiplied with the delta shape values) to account for certain variations (e.g., shape variations and slope changes) of the delta shape profile which may have a larger impact on wafer deformation during processing (e.g., IPD distortion). Delta shape profile variations may be quantified as standard variation, variance, or range based on the delta shape value within defined moving windows along a direction of the respective scanned diameter line 302. A threshold may be predetermined for the amount of variation tolerated before applying a weighting factor. For example, if a delta shape profile variation (e.g., a shape variation or slope change) determined based on delta shape values within a defined window is above a predetermined threshold, then a weighting factor may be applied to each delta shape value within the defined window.

The weighting factors may be applied based on area variation within defined moving windows along the direction of the respective scanned diameter line 302. High variation of area within a relatively narrow window (e.g., less than 20 mm) may result in wafer distortion because the wafer is susceptible to higher chucking pressure in that window. The area variation may be quantified, for example, as standard variation, variance, or range of the area of delta shape profile within the defined windows. Defined windows may have a size, for example, less than 20 mm, less than 15 mm, or 11 mm. A weighting factor is applied to the delta shape values within a window if the area variation of the delta shape profile in the window is above a predetermined threshold. In one example embodiment, the area variation is quantified as standard variation, and the threshold is equal to or greater than 0.3, equal to or greater than 0.4, or equal to or greater than 0.5. The weighting factor in these embodiments may be the standard variation itself. Accordingly, in one example, a weighting factor of 0.4 is applied if the standard deviation is greater than or equal to 0.4 in the defined window, and a weighting factor is not applied (i.e., the weighting factor is zero) if the standard deviation is less than 0.4 in the defined window.

The weighting factors may also be applied based on slope changes of the delta shape profile within defined moving windows along the direction of the respective scanned diameter line 302. Significant turning points of the wafer surface profile within a relatively narrow window (e.g., less than 10 mm) may result in wafer distortion because the wafer is susceptible to higher chucking pressure in that window. The slope changes of the delta shape profile may be quantified, for example, by comparing the direction and amount of slope in two adjacent defined windows. Each adjacent defined window may have a size, for example, less than 20 mm, less than 10 mm, or 5 mm. A weighting factor is applied to the delta shape values within the defined windows if the slope change is outside a predetermined threshold. In one embodiment, the slopes are compared by multiplying the slopes, and the threshold is a negative value (representing a slope change) less than $-0.3$, less than $-0.35$, less than $-0.4$, less than $-0.45$, less than $-0.5$, or less than $-0.5$. The weighting factors in these embodiments may be from more than 1 to 3, or from 1.1 to 2, or from 1.2 to 1.4, or 1.3. The weighting factor may be set to 1 if the threshold is not met. Accordingly, in one example, if the slope change is determined to be less than $-0.4$, a weighting factor of 1.3 is applied, and if the slope change is determined to not be less than $-0.4$, a weighting factor of 1 is applied.

Both the area variation and slope changes of the delta shape profiles within defined windows may be used to determine weighting factors applied to the delta shape profiles when generating the Gapi profiles. In these embodiments, the weighting factors to be applied (e.g., multiplied with the delta shape values within the appropriate windows) may be determined by multiplying the weighting factors determined for the area variation and slope changes. For example, each weighting factor $SW_n$ to be applied to delta shape values calculated for a respective scanned diameter line 302 within the defined windows may be calculated by the formula:

$$SW_n(x)=(SV_n(x)+1)*(SC_n(x))$$

where n identifies the scanned diameter line, x is the relative distance (in mm) of the point from the center 306 of the wafer 300 measured along the scanned diameter line n, $SV_n(x)$ is the weighting factor to be applied based on the standard variation if the point at x is within an appropriate window, and $SC_n(x)$ is the weighting factor to be applied based on the slope changes if the point at x is within an appropriate window. In this example, $SC_n(x)$ is either 1 (default if no weighting factor applied) or greater than 1 (i.e., the determined weighting factor).

With reference to FIGS. 7a and 7b, an example set of plots generated using measurement data obtained by a geometry measurement tool (e.g., by scanning the surface 304 of the wafer 300 along scan lines as shown in FIGS. 3-5) in accordance with the present disclosure is shown. Scan profiles were obtained by scanning a front-end processed wafer surface along 8 diameter lines (indicated as Line:0-Line:7 in FIGS. 7a and 7b). Raw shape profiles and ideal shape profiles were generated for each scanned diameter line and are shown in each plot. Delta shape profiles (not shown) for each diameter line were also generated based on the raw shape and ideal shape profiles as described above. Weighting factors were determined in this example based on shape deviations and/or slope changes in the delta shape profile within defined windows. The Gapi profile for each diameter line (shape delta*shape weight) was generated by applying the weighting factors to the delta shape values in the appropriate windows.

Referring back to FIG. 8, at step 412 a Gapi value for the wafer is calculated based on the Gapi profiles generated for the scanned diameter lines 302. The Gapi value is a global metric which can be used to describe overall variations of wafer flatness and/or shape relative to an ideal plane. It can be calculated based on the Gapi profiles as, for example, a root-mean-square value of the values included in the Gapi profiles. As such, the Gapi value may also be referred to herein as a "Gapi root-mean-square" or "Gapi rms."

Figure 9:
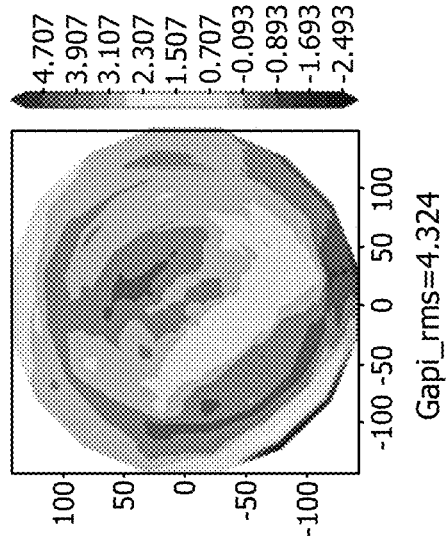
FIG. 9 is a contour map of a front-end processed wafer showing a raw profile of the wafer.
Figure 10:
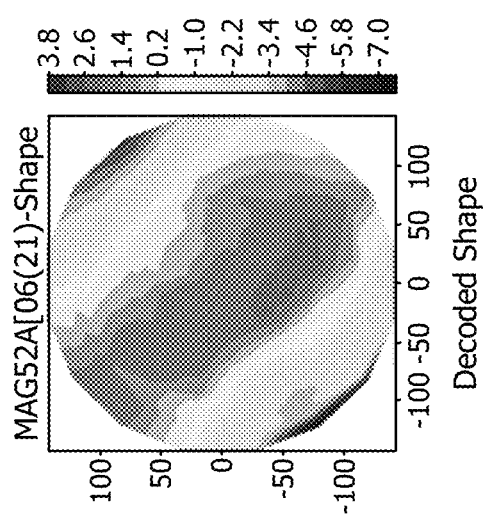
FIG. 10 is a contour map of the front-end processed wafer of FIG. 9, showing a Gapi profile of the wafer.
Figure 11:
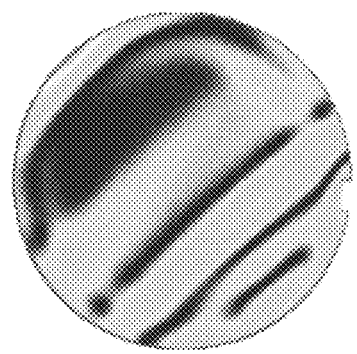
FIG. 11 is a contour map of the front-end processed wafer of FIG. 9, showing an in-plane distortion (IPD) profile of the wafer.
Figure 12:
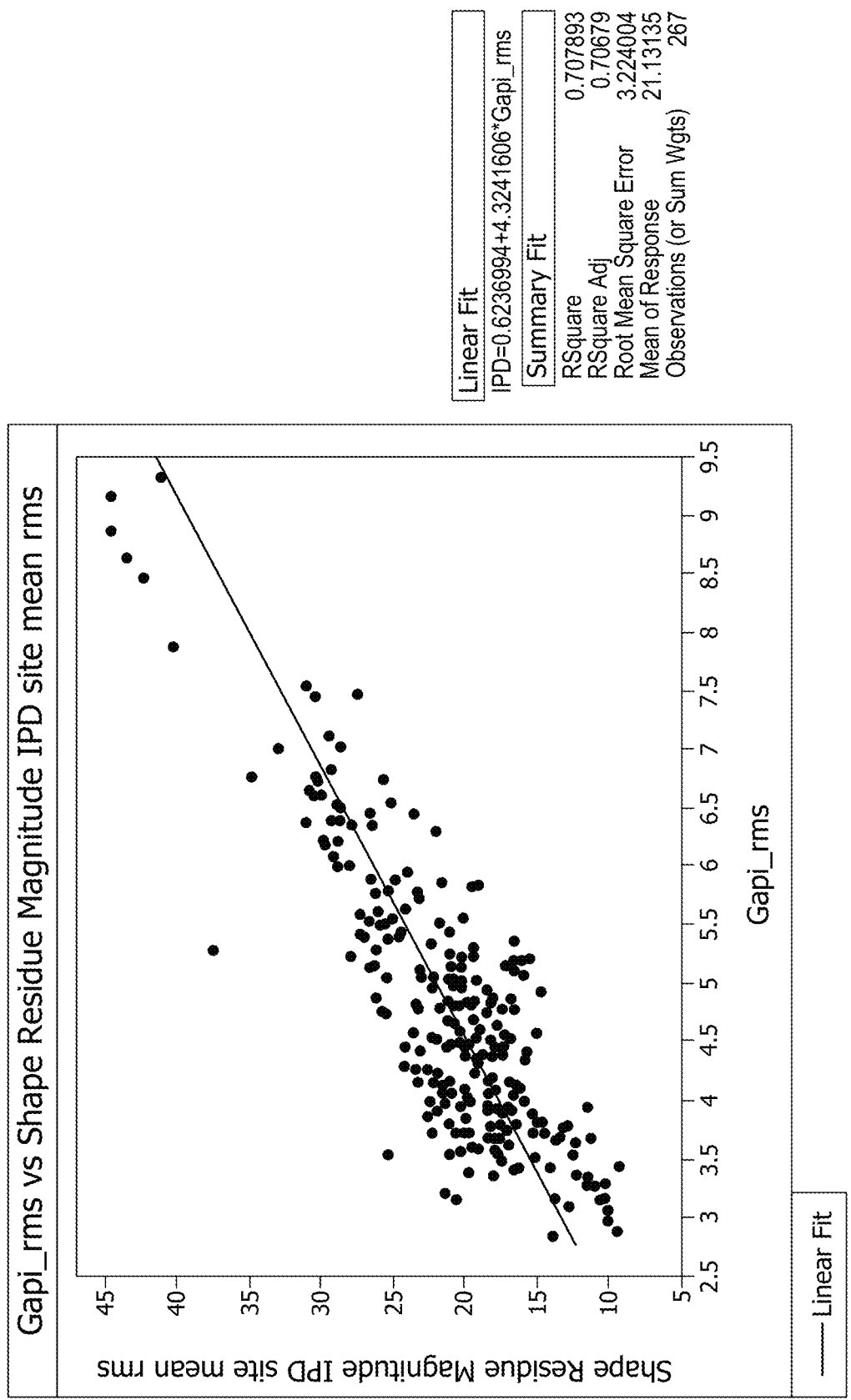
FIG. 12 is a plot showing the correlation between the Gapi values calculated for front-end processed wafers and IPD root-mean-square values calculated for the wafers.

With reference to FIGS. 9-12, it has been shown that a Gapi value calculated for a front-end processed wafer has good correlation with an IPD prediction index provided by a Patterned Wafer Geometry (PWG) metrology system (such as the WaferSight™ PWG5™ platform manufactured by KLA-Tencor Corporation). The PWG metrology system uses raw PWG data obtained from a high accuracy inspection tool (such as a WaferSight™ 2 or 2+ bare wafer metrology system manufactured by KLA-Tencor Corporation) to assess in-process wafer distortion based on changes in wafer shape and predict overlay error. FIG. 9 shows a contour map of the raw localized shape features of a front-end processed wafer. As shown in FIGS. 10 and 11, contour maps of the Gapi profiles generated for the front-end processed wafer (FIG. 10) and the IPD map generated using the PWG metrology system based on in-process wafer data (FIG. 11) indicate that IPD may be predicted based on the Gapi profiles generated for the front-end processed wafer. More specifically, the generated Gapi profile features of the wafer of FIG. 10 (with a Gapi value of 4.324) correlate well with the calculated IPD site mean root-mean-square metrics and the IPD map of FIG. 11 of the same wafer (having the localized shape features shown in FIG. 9), where the IPD metrics and IPD map are determined after a final polishing step. FIG. 12 shows that the calculated global metrics (both taken as a root-mean-square of the local values) of the Gapi profiles and the IPD values have a strong correlation, with a $R^2$ value of greater than 0.7 for various wafer shapes.

Figure 13:
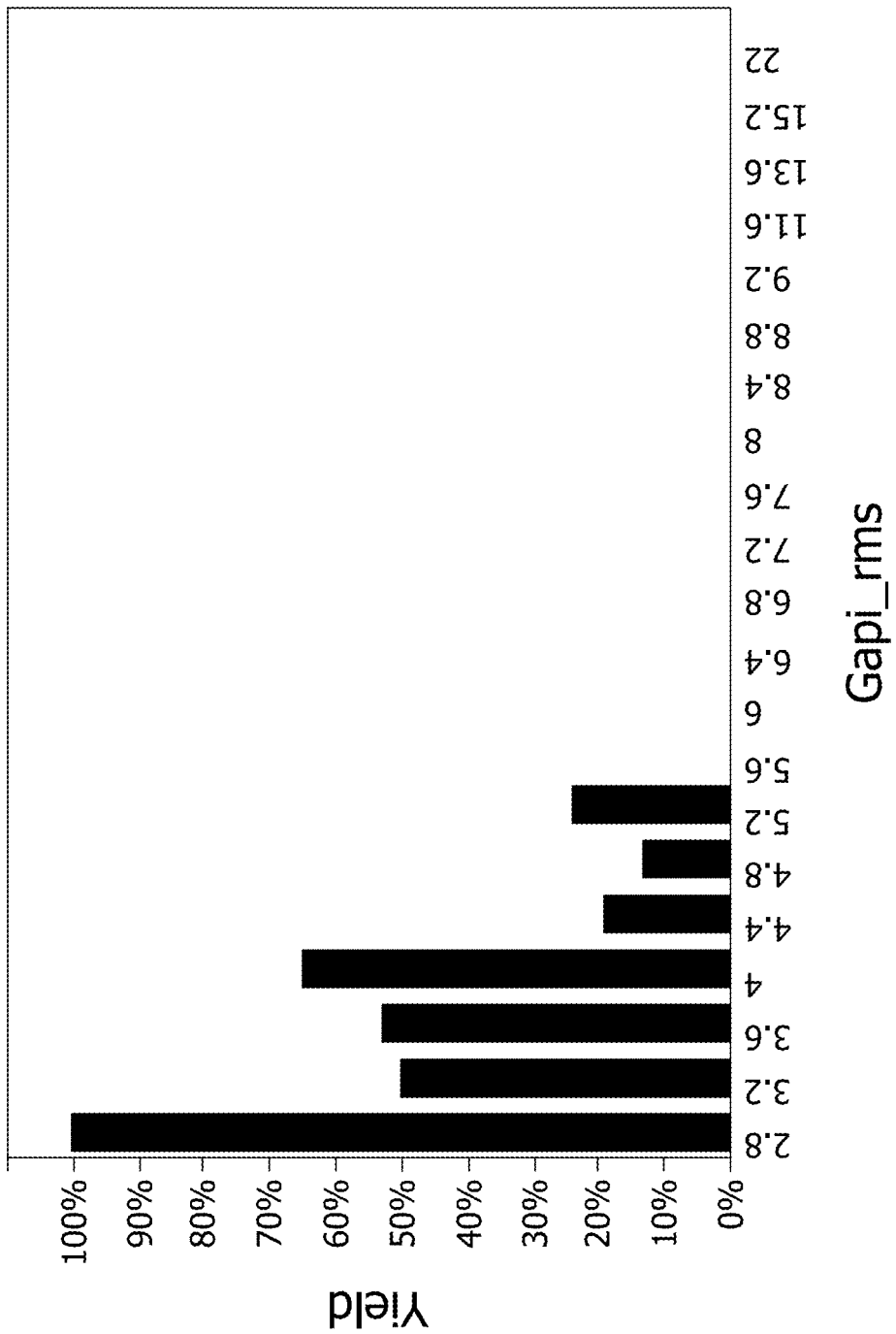
FIG. 13 is a bar graph showing the relationship between calculated Gapi values of front-end processed wafers and back-end yield percentages of the wafers.

With reference to FIG. 13, a Gapi value of a front-end processed wafer may be used to predict the back-end yield of quality wafers. The graph in FIG. 13 shows that for Gapi values of or below 4, particularly of or below 3.6, and more particularly of or below 3.2, high back-end yield of greater than 50% can be obtained. The back-end yield percentages may be obtained by empirical data from wafer grading, or from wafer metrics based on in-process wafer distortion (such as a yield rate based on an IPD metric of a post-polished wafer). Because the Gapi metrics according to the present disclosure have a strong correlation with in-process wafer metrics, it may be assumed that predicted back-end yield rates correlating to the in-process wafer metrics will similarly correlate to the respective Gapi metrics. Front-end processed wafers may be sorted (such as at step 206 in process 200) if the calculated Gapi value of the wafer does not meet a predetermined threshold. The threshold may be set to Gapi value that correlates with a high back-end yield percentage (e.g., greater than 50%, greater than 60%, or greater than 70%). In this regard, advantages such as higher back-end yield, reducing the need for overlay error control, and salvaging of poorer quality wafers can be achieved.

Figure 14:
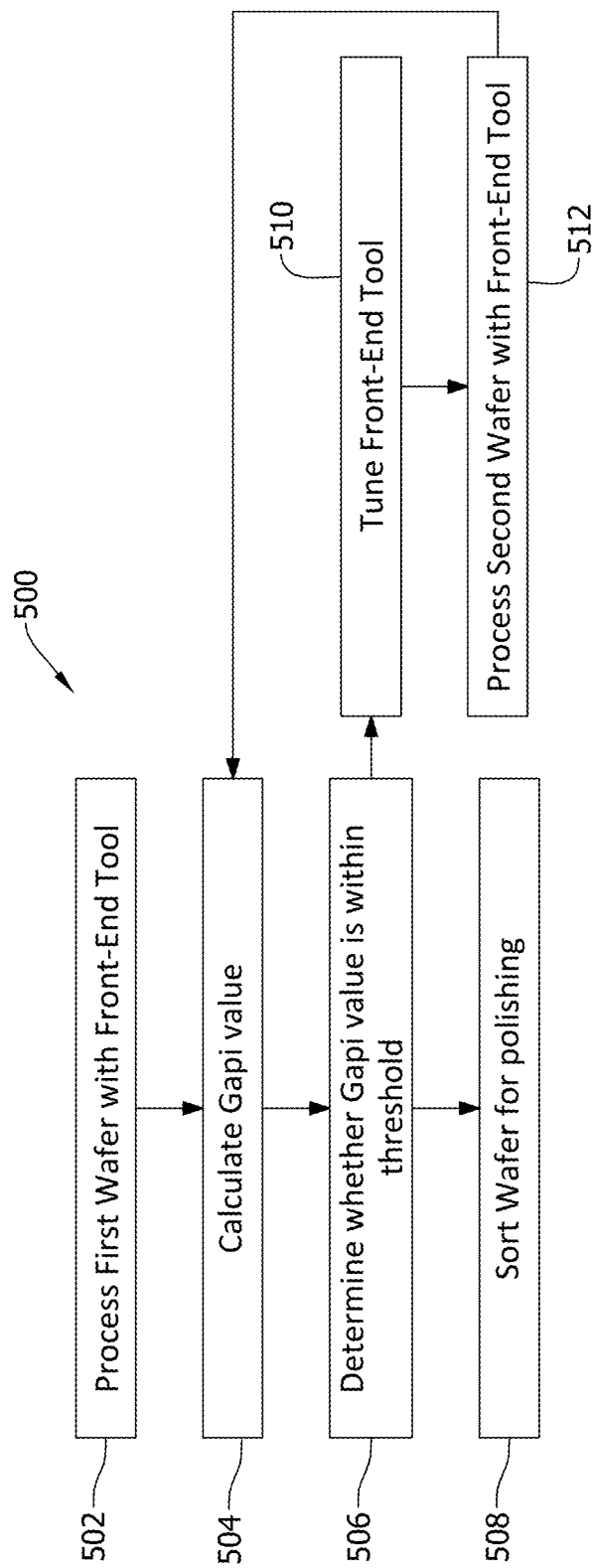
FIG. 14 is a process flow of a method for adjusting a front-end process tool based on a Gapi value.

With reference to FIG. 14, an example process flow 500 for adjusting a front-end process tool based on a calculated Gapi value is shown. At step 502, a wafer is processed by a front-end process tool (e.g., front-end process tool 702 shown in FIG. 27). For example, a wafer may be sliced from a single crystal ingot of semiconductor material (e.g., silicon) using a wire saw. The wafer may also be brought to a desired thickness using a front-end process tool such as a lapping tool or a grinding tool.

At step 504, a Gapi value of the front-end processed (e.g., wire sawed, lapped and/or grinded) wafer is calculated in accordance with the present disclosure (e.g., by process 400 shown in FIG. 8). At step 506, the Gapi value is compared to a predetermined threshold value. The predetermined threshold value may be based on historical data which correlates a Gapi value to a back-end yield percentage. For example, the threshold may be set to a Gapi value which correlates with a back-end yield percentage of greater than 50%. In one example embodiment, the threshold is set based on the data shown in the graph of FIG. 13. In some examples, the predetermined threshold of the Gapi value is less than 6, less than 5.5, less than 5, less than 4.5, such as less than 4, or less than 3.5. If the Gapi value is within the predetermined threshold (e.g., less than or equal to the threshold Gapi value, such as less than or equal to 5), then the front-end processed wafer is sorted for polishing at step 508.

If the Gapi value is not within the predetermined threshold (e.g., is greater than the threshold Gapi value), then the wafer may not be sorted for polishing. At step 510, one or more of the front-end process tools may be tuned (e.g., adjusted and/or modified) after determining the Gapi value of the front-end processed wafer is not within the predetermined threshold. The one or more front-end process tools may be tuned based on at least one of the Gapi profiles of the wafer having a Gapi value outside the predetermined threshold.

Expanding on step 510 of process 500, additional reference is made to FIGS. 15-22. FIGS. 15-18 show a contour map of the raw localized shape features (FIG. 15), a chart of the raw shape profile, ideal shape profile, and the Gapi profile plots for a single scanned diameter line (FIG. 16), a contour map of the Gapi profiles (FIG. 17), and an IPD contour map (FIG. 18), of a front-end processed wafer having a Gapi value of 5.41, which in this example embodiment is not within (e.g., is greater than) a predetermined threshold for step 506 of process flow 500. Accordingly, the front-end processed wafer of FIGS. 15-18 is not sorted for polishing at step 508.

Figure 16:
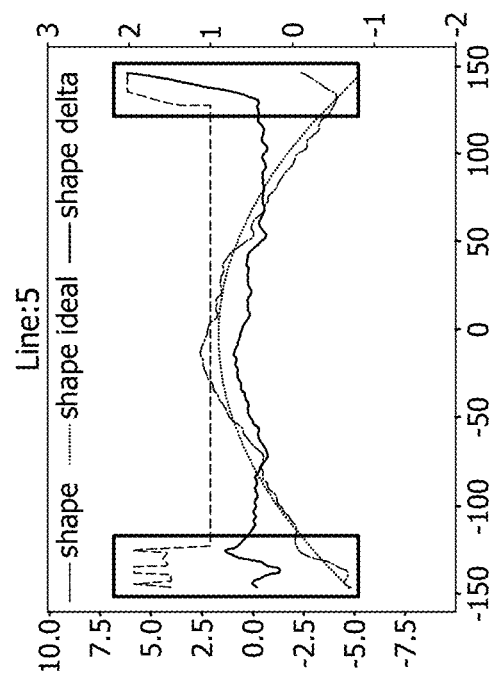
FIG. 16 is a plot generated using measurement data of the front-end processed wafer of FIG. 15 obtained by a geometry measurement tool and a wafer surface scan along a scan line.
Figure 18:
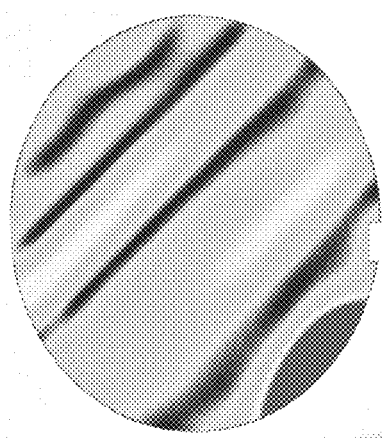
FIG. 18 is a contour map of the front-end processed wafer of FIG. 15, showing an IPD profile of the wafer and an IPD mean root-mean-square value calculated from the IPD profile.
Figure 15:
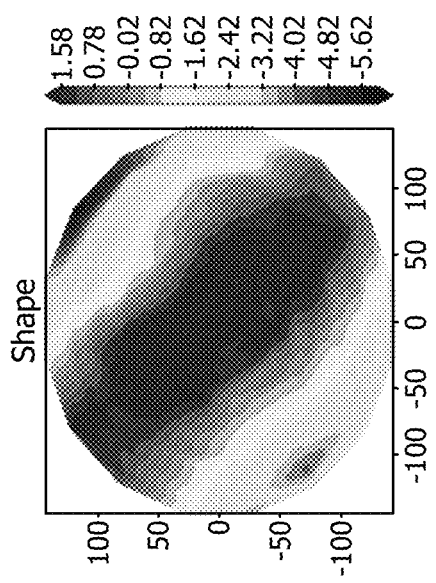
FIG. 15 is a contour map of a front-end processed wafer showing a raw profile of the wafer, before tuning of a front-end process tool.
Figure 17:
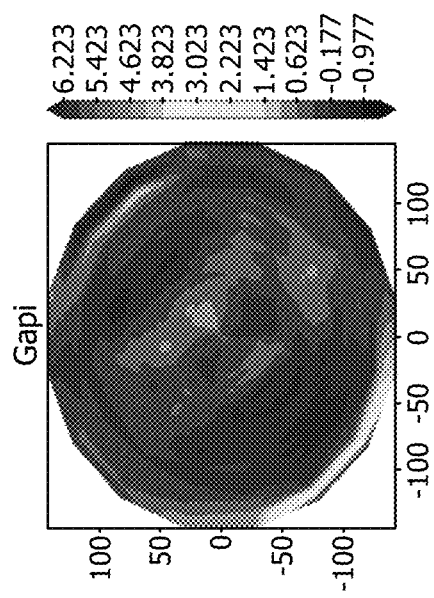
FIG. 17 is a contour map of the front-end processed wafer of FIG. 15, showing a Gapi profile of the wafer and a Gapi value calculated from the Gapi profile.
Figure 20:
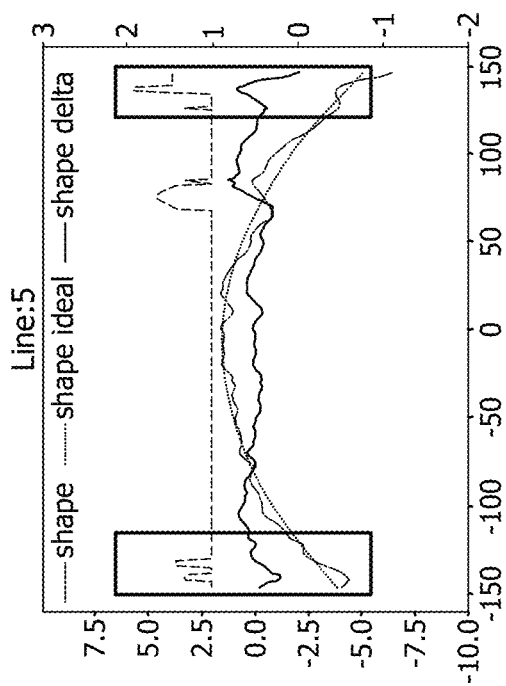
FIG. 20 is a plot generated using measurement data of the front-end processed wafer of FIG. 19 obtained by a geometry measurement tool and a wafer surface scan along a scan line.
Figure 22:
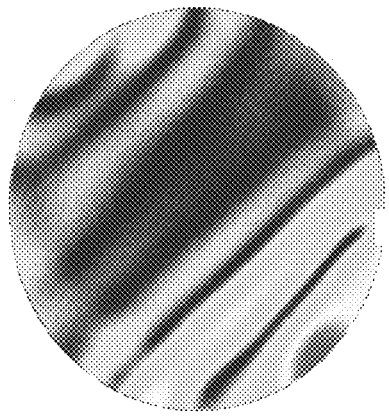
FIG. 22 is a contour map of the front-end processed wafer of FIG. 19, showing an IPD profile of the wafer and an IPD mean root-mean-square value calculated from the IPD profile.
Figure 19:
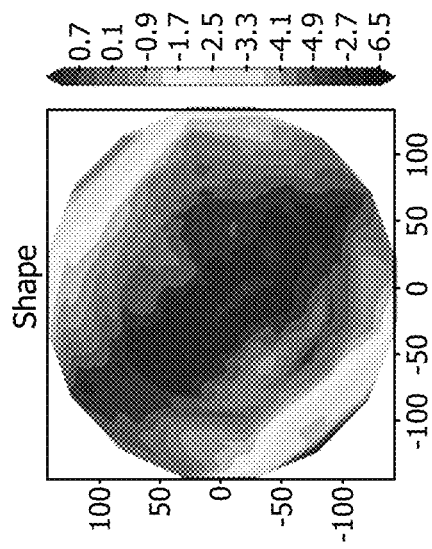
FIG. 19 is a contour map of a front-end processed wafer showing a raw profile of the wafer, after tuning of a front-end process tool.
Figure 21:
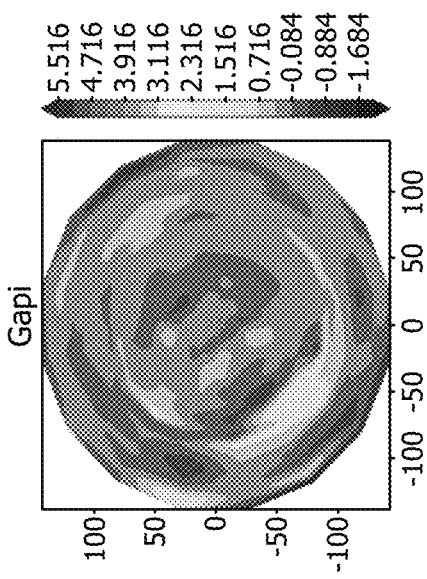
FIG. 21 is a contour map of the front-end processed wafer of FIG. 19, showing a Gapi profile of the wafer and a Gapi value calculated from the Gapi profile.

At step 510, one or more front-end process tools may be tuned (e.g., modified and/or adjusted) based on at least one of the Gapi profiles used to calculate the Gapi value shown in FIG. 17, such as the Gapi profile shown in FIG. 16. In this example embodiment, a wire saw may be tuned based on at least one Gapi profile of the wafer. The Gapi profile plot in FIG. 16 shows the Gapi profile of the diameter line (i.e., Line:5) of the wafer that is parallel (or substantially parallel) to the cutting direction of the wire saw. It is observed that relatively high Gapi values of the Gapi profile are located at certain points along the diameter line in a direction of the scanned diameter line, which as shown in FIG. 16 are at distances near radial edges of the wafer. Based on this observation, the wire saw may be tuned to correct the high variations at these points. For example, the value of the slurry temperature or the bearing temperature at positions corresponding to these high variation points near the radial edge of the wafer may be adjusted to provide a smoother wafer shape upon the entrance and exit of the wire as the wafer is cut from a single crystal ingot.

At step 512, the tuned front-end process tool is then used to provide a second front-end processed wafer. FIGS. 19-22 show a contour map of the raw localized shape features (FIG. 19), a chart of the raw shape profile, ideal shape profile, and the Gapi profile plots for a single scanned diameter line (FIG. 20), a contour map of the Gapi profiles (FIG. 21), and an IPD contour map (FIG. 22), of a second front-end processed wafer after the front-end process tool is tuned based on the observations from FIGS. 15-18. As shown in FIGS. 19-22, the tuning of the front-end process tool results in the second front-end processed wafer with improved Gapi profiles (with less variation at the radial edges), as well as a lower Gapi value (3.42) and IPD mean root-mean-square value (16.45). The second front-end processed wafer provided after the tuning step may be the same wafer processed at step 502, which has been salvaged by repeating the front-end process step. The second front-end processed wafer processed by the tuned front-end tool may also be a different wafer.

One advantage of the process 500 is that adjustments and/or modifications of the front-end tool may be made more quickly and efficiently using a metric that is generated and/or calculated early on in the wafering process (e.g., before polishing). Existing metrics used to predict wafer deformation during fabrication require the wafer be polished in order to obtain high quality shape and/or flatness data of the wafer. Process anomalies in front-end tools (e.g., wire saw, lapping tool, or grinding tool) therefore cannot be identified until after the front-end processed wafer is polished. Generally, significant time passes (hours, days, weeks) between the front-end processing and the polishing of a given wafer. In the meantime, a large volume of wafers may be processed by the front-end tool(s), and therefore are at risk of surface variations and unacceptable Gapi values that will not be identified until the initial wafer is polished and scanned. In this regard, process 500 provides a significant improvement by providing early detection of process anomalies in the front-end process which can be fixed by tuning the front-end tool(s) and thereby impact fewer wafers.

With reference to FIGS. 23-26, a method for determining a Gapi edge metric for a front-end processed wafer is described. In addition to Gapi metrics used in accordance with the present disclosure, Gapi edge metrics may be used to characterize wafer edge profiles. Wafer edge conditions are known to significantly impact the edge die yield. For example, issues associated with film layer peeling (i.e., delamination), particle contamination, and photoresist coating offset error, each of which negatively impact edge die yield, are known to arise from wafer edge defects. Using Gapi edge metrics in accordance with the present disclosure can ensure wafers with sufficiently smooth edges are fabricated and therefore provide similar improvements in back-end yield as discussed above with respect to Gapi metrics.

Figure 23:
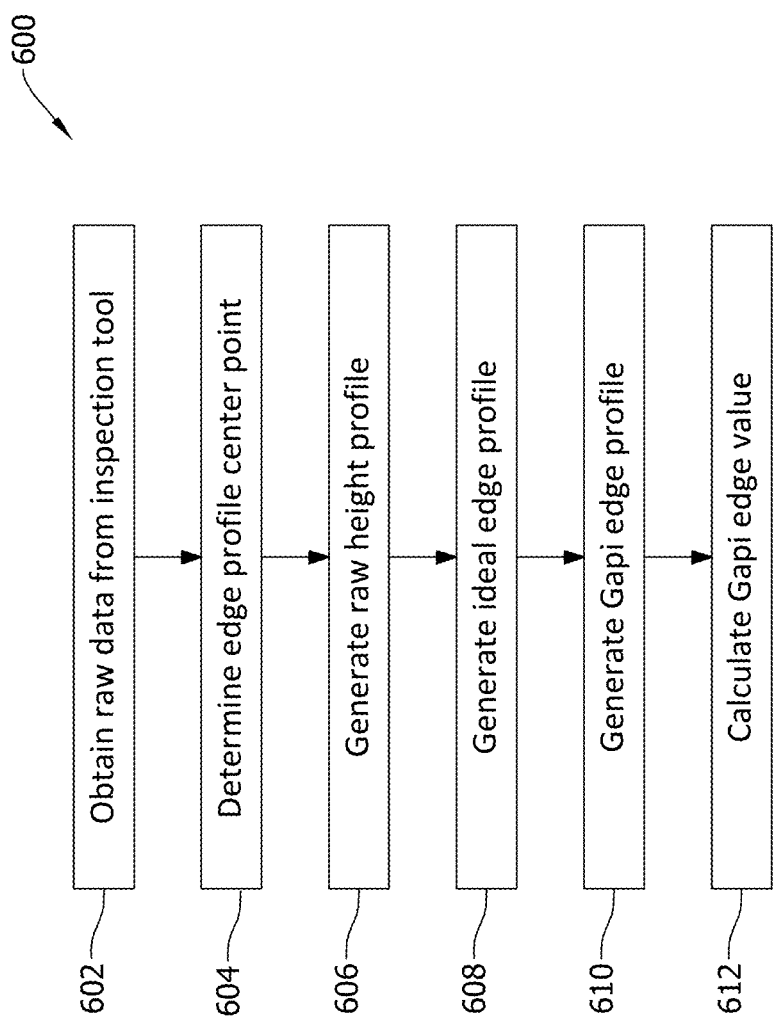
FIG. 23 is a process flow of a method for calculating Gapi edge values of a front-end processed wafer in accordance with the present disclosure.

In FIG. 23, a process 600 for calculating Gapi edge values of a front-end processed wafer is shown. At step 602, measurement data of an edge profile of the front-end processed wafer is obtained. For example, the edge profile data may be obtained using commercial 3D microscopes such as by coherence scanning interferometric, confocal laser scanning, or laser scanning microscopes (such as those manufactured by Zygo, Olympus, or Keyence). The measured wafer may be in an unchucked (i.e., free-standing) state.

At step 604, a simplification algorithm is used to convert the edge profile data into a simplified curve by reducing the set of points included in the edge profile. For example, a simplified curve of the edge profile data may be generated based on the Ramer-Douglas-Peucker algorithm (i.e., the iterative end-point fit algorithm). In this example, the amount of points comprising the edge profile may be set by tuning the epsilon (ε) parameter used in the Ramer-Douglas-Peucker algorithm, as is understood by those skilled in the art. In one embodiment, ε is tuned to reduce the numbers of the curve to 3 points. The profile center point is determined as the mid-point on the simplified curve. For example, the profile center point is determined as the middle of the 3 points on the simplified curve in one embodiment.

Figures 24, 25:
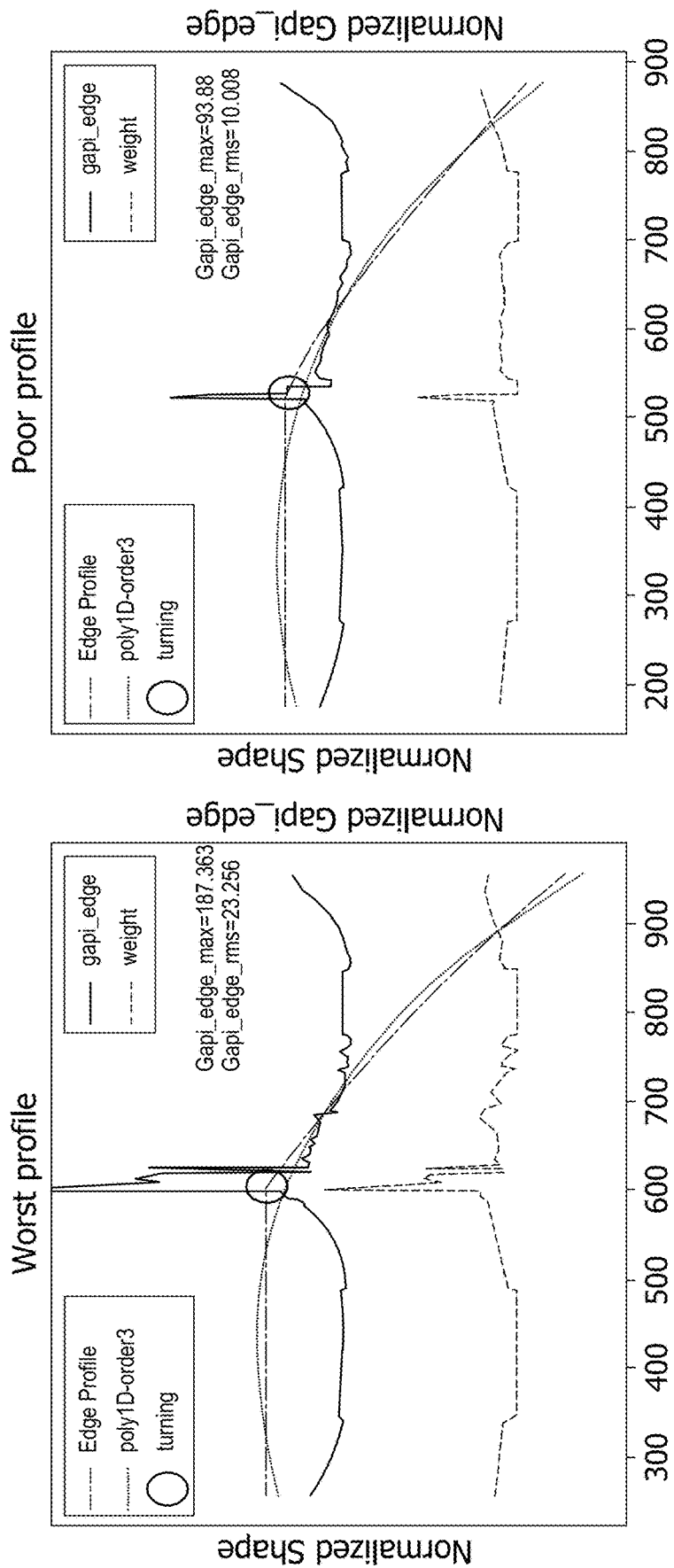
FIGS. 24-26 are plots of edge profiles of front-end processed wafers.
Figure 26:
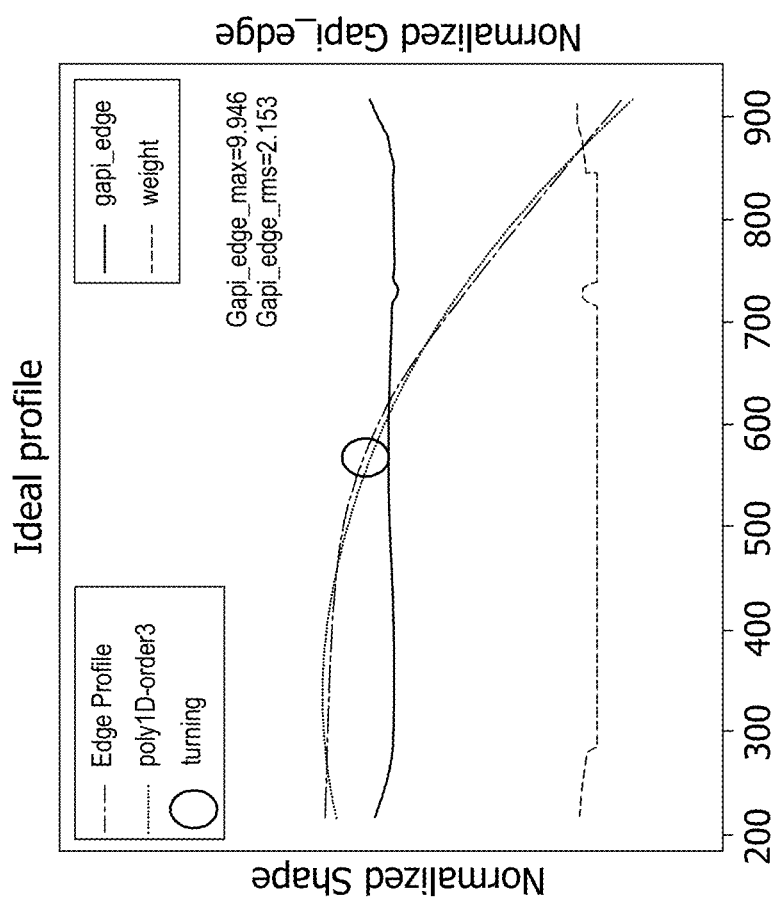

At step 606, a centered raw height profile is generated based on the edge profile data obtained at step 602 and the profile center point determined at step 604. Raw height points are extracted from the edge profile based on the profile center point. For example, raw height points located +/− a number of points N from the edge profile center point are extracted. N is adjusted to screen out front or tail points. For example, N may be more than 200 points and less than 400 points, more than 300 points and less than 375 points, or 350 points. Because the number of raw points extracted on each side of the profile center point is the same value N, the edge profile center point will be the turning point of the curve (as shown in FIGS. 24-26).

At step 608, an ideal edge profile is generated based on the centered raw height profile. The ideal edge profile may be generated based on polynomial regression of the centered raw height profile. In one example, the ideal edge profile includes ideal edge values calculated based on 3rd-order polynomial fitting of the raw height values of the points included in the centered raw height profile. Each ideal edge value can be represented by the example formula:

$$IE(x) = a*(RH(x))^3 + b*(RH(x))^2 + c*(RH(x)) + d$$

where x is a relative distance along the centered edge profile direction from a reference point x=0, RH(x) is the raw height value of the centered raw height edge profile at x, a, b and c are polynomial coefficients and d is error determined by the polynomial fit analysis. The polynomial fit analysis is executed using, for example, NumPy in Python (i.e., np.polyfit curve fitting function).

At step 610, a Gapi edge profile is generated for the wafer. The Gapi edge profile may be generated based on the ideal edge profile and the centered raw height profile. In one example embodiment, the Gapi profile is generated by generating a delta edge profile. The delta edge profile includes delta edge values that may be calculated by comparing the ideal edge value and the raw height value at each point along the centered raw height profile. For example, the delta edge profile may be represented by the formula:

$$DE(x)=IE(x)-RH(x)$$

where x is a relative distance along the centered edge profile direction from a reference point x=0, RH(x) is the raw height value of the centered raw height edge profile at x, and IE(x) is the ideal edge value of the ideal edge profile at x. The delta edge profile is able to describe the wafer edge condition of the wafer by quantifying deviations of the centered raw height profile from the ideal edge profile. In some embodiments, the Gapi edge profile is generated based solely on the delta edge profile.

The Gapi edge profile may be based on the generated delta edge profile and weighting factors applied to the delta edge profile. The weighting factors may be applied (e.g., multiplied with the delta edge values) to account for certain delta edge profile variations (e.g., shape variations and slope changes) of the delta edge profile which may have a larger impact on wafer deformation during processing (e.g., IPD distortion). Delta edge profile variations may be quantified as standard variation, variance, or range based on the delta edge profile within defined moving windows along the centered edge profile direction. A threshold may be predetermined for the amount of variation or slope change of the delta edge profile tolerated before applying a weighting factor. For example, if a variation change determined based on delta edge values within a defined window is above a predetermined threshold, then a weighting factor may be applied to each delta edge value within the defined window.

Weighting factors may be applied based on area variation within defined windows along the centered edge profile direction. High variation of area of the edge profile within a relatively narrow window (e.g., less than 20 points) may result in wafer distortion because the wafer is susceptible to higher chucking pressure in that window. The area variation may be quantified, for example, as standard variation, variance, or range of the area of delta edge profile within defined windows. Defined windows may have a size, for example, less than 20 points, less than 15 points, or 11 points. A weighting factor is applied to the delta edge values within a window if the area variation of the delta edge profile in the window is above a predetermined threshold. In one example embodiment, the area variation is quantified as standard variation, and the threshold is greater than or equal to 800 nm, greater than or equal to 900 nm, greater than or equal to 1000 nm, greater than or equal to 1100 nm, or greater than or equal to 1200 nm. The weighting factor in these embodiments may be calculated by dividing the standard variation itself by the threshold value. Accordingly, in one example, a weighting factor of (SV/1000) is applied if the standard variation (SV) is greater than or equal to 1000 nm in the defined window, and a weighting factor is not applied (i.e., the weighting factor is zero) if the standard deviation is less than 1000 nm in the defined window.

The weighting factors may also be applied based on slope changes of the delta edge profile defined windows along the centered edge profile direction. Significant turning points of the wafer edge profile along a narrow window size (e.g., less than 70 points) may result in wafer distortion because the wafer is susceptible to higher chucking pressure in that window. The slope changes of the delta edge profile may be quantified, for example, by comparing the direction and amount of slope in two adjacent defined windows. Each adjacent defined window may have a size, for example, less than 50 points, less than 40 points, or 33 points. A weighting factor is applied to the delta edge values within the defined windows if the slope change is outside a predetermined threshold. In one example embodiment, the slopes are compared by multiplying the slopes, and the threshold is a negative value (representing a slope change) less than −0.3, less than −0.35, less than −0.4, less than −0.45, less than −0.5, or less than −0.55. The weighting factors in these embodiments may be from 3 to 9, or from 4 to 8, or 6. The weighting factor may be set to 1 if the threshold is not met. Accordingly, in one example, if the slope change is determined to be less than −0.45, a weighting factor of 6 is applied, and if the slope change is determined to not be less than −0.45, a weighting factor of 1 is applied.

Both the area variation and slope changes of the delta edge profiles within defined windows may be used to determine weighting factors applied to the delta edge profiles when generating the Gapi edge profiles. In these embodiments, the weighting factors to be applied (e.g., multiplied with the delta edge values within the appropriate windows) may be determined by multiplying the weighting factors determined for the area variation and slope changes. For example, each weighting factor $SW_E$ to be applied to delta edge values within the defined windows may be calculated by the formula:

$$SW_E(x)=(SV_E(x)/1000+1)*(SC_E(x))$$

where x is a relative distance along the centered edge profile direction from a reference point x=0, $SV_E(x)$ is the weighting factor to be applied based on the standard variation of the delta edge profile if the point at x is within an appropriate window, and $SC_E(x)$ is the weighting factor to be applied based on the slope changes of the delta edge profile if the point at x is within an appropriate window. In this example, $SC_E(x)$ is either 1 (default if no weighting factor applied) or greater than 1 (i.e., the determined weighting factor).

With reference to FIGS. 24-26, an example set of plots generated in accordance with process 600 is shown. In particular, a Gapi edge plots of each of a wafer edge having a worst edge profile, a wafer edge having a poor edge profile, and a wafer edge having an ideal edge profile are shown. Measurement data of the edge profiles of each wafer edge was obtained using commercial 3D microscopes (such as those described above at step 602). A centered raw height profile and an ideal edge profile generated for each wafer edge are shown in each plot. Delta edge profiles (not shown) for each wafer edge were also generated based on the centered raw height profile and ideal edge profile. As discussed above, weighting factors were determined in this example based on shape deviations and/or slope changes in the delta edge profile of each wafer edge within defined windows. The Gapi edge profile for each wafer edge (edge delta*edge weight) was generated by applying the weighting factors to the delta edge values in the appropriate windows.

Referring back to FIG. 23, at step 412 a Gapi edge value for the wafer is calculated based on the Gapi edge profile of the wafer edge. The Gapi edge value is a global metric which can be used to describe overall variations of the wafer edge profile to an ideal plane. In one example embodiment, the Gapi edge value is calculated based on the Gapi edge profile as, for example, a root-mean-square value (also referred to as a "Gapi edge root-mean-square" or "Gapi edge rms") of the values comprising the Gapi edge profile. In another example embodiment, the Gapi edge value is calculated as the maximum edge value (also referred to as a "Gapi edge maximum value" or "Gapi edge max") of the Gapi edge profile.

As shown in FIGS. 24-26, Gapi edge values calculated as the root-mean-square and/or as the max value of the Gapi edge profile are able to describe the wafer edge profile. For example, a good edge profile may be characterized as having a Gapi edge value within a predetermined threshold (e.g., a Gapi edge max of less than 90 and/or a Gapi edge rms less than 10). The predetermined threshold may be determined as discussed above for Gapi values, such as by a correlation of the Gapi edge value and back-end yield percentage. In some examples, the predetermined threshold for a Gapi edge value calculated as the root-mean-square of the Gapi edge profile may be less than 10, less than 9, less than 8, less than 7, less than 6, less than 5, less than 4, or less than 3. In some examples, the predetermined threshold for a Gapi edge value calculated as the max value of the Gapi edge profile may be less than 90, less than 80, less than 70, less than 60, less than 50, less than 40, less than 30, less than 20, or less than 10.

Referring again to FIG. 14, the process flow 500 for adjusting a front-end process tool may include adjusting the front-end process tool using the Gapi edge value calculated as described herein. At step 502, a first wafer is processed by a front-end process tool (e.g., front-end process tool 702 shown in FIG. 27), as described above. At step 504, a Gapi edge value of the first front-end processed wafer is calculated in accordance with the present disclosure (e.g., by process 600 shown in FIG. 23). At step 506, the Gapi edge value is compared to a predetermined threshold value. If the Gapi edge value is within the predetermined threshold (e.g., less than or equal to the threshold Gapi edge max value, such as less than or equal to 90, or less than or equal to the threshold Gapi edge rms value, such as less than or equal to 10), then the first front-end processed wafer is sorted for polishing at step 508. If the Gapi edge value is not within the predetermined threshold (e.g., is greater than the threshold Gapi edge max value or Gapi edge rms value), then the first wafer may not be sorted for polishing. At step 510, one or more of the front-end process tools may be tuned (e.g., adjusted and/or modified) after determining the Gapi edge value of the first front-end processed wafer is not within the predetermined threshold. The one or more front-end process tools may be tuned based on the Gapi edge profile of the wafer having a Gapi edge value outside the predetermined threshold. At step 512, the tuned front-end process tool is then used to provide a second front-end processed wafer, which may be same as the first front-end processed wafer or a different wafer.

Figure 27:
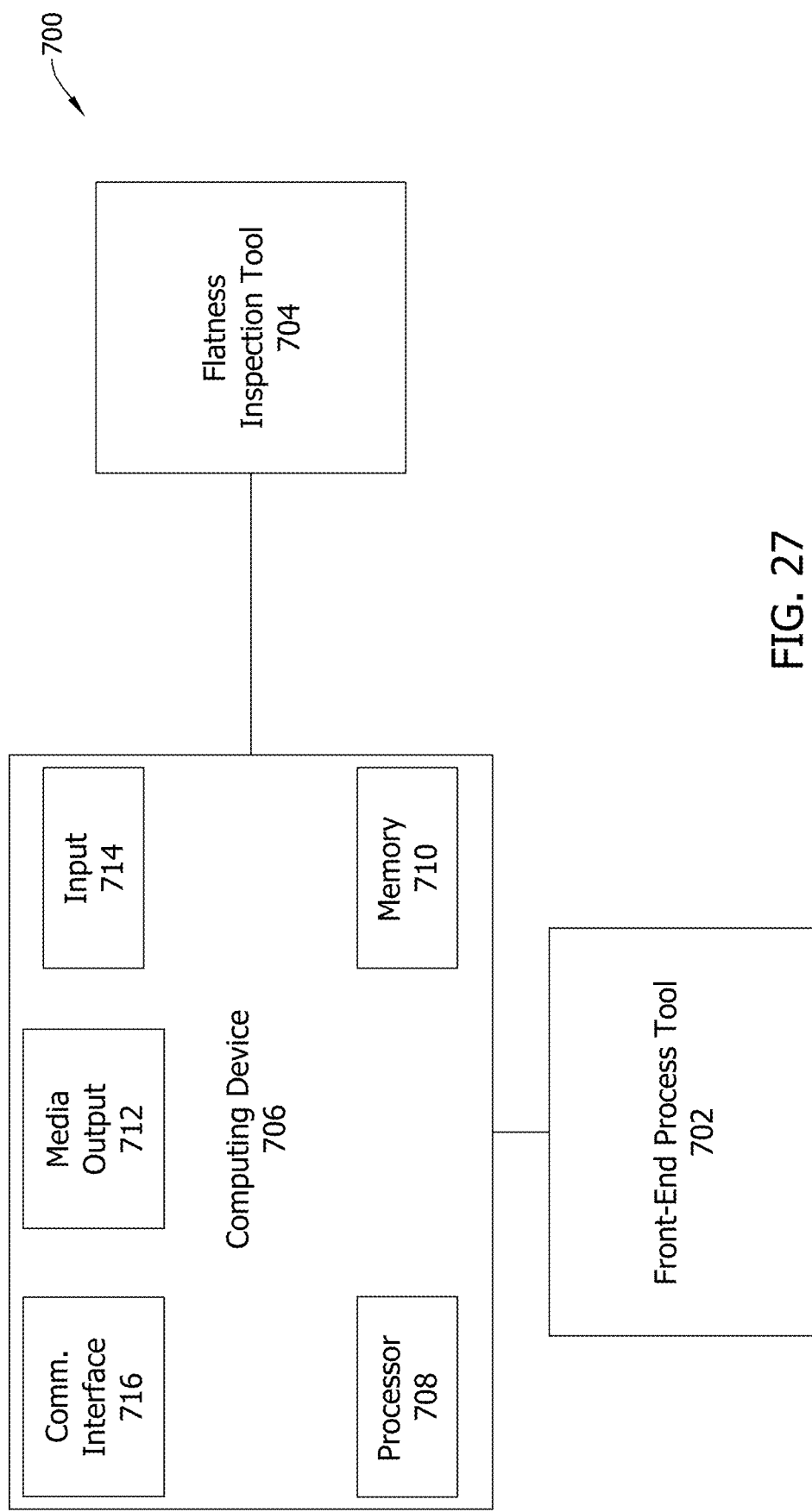
FIG. 27 is a block diagram of an example system for processing a wafer using a front-end processed wafer geometry metric in accordance with the present disclosure.

With reference to FIG. 27, a block diagram of a system 700 for processing a wafer using a front-end processed wafer geometry metric in accordance with the present disclosure is shown. System 700 includes a front-end process tool 702, a flatness inspection tool 704, and a computing device 706 which is connected or communicatively coupled to the front-end process tool 702 and/or the flatness inspection tool 704.

The front-end process tool 702 may be any machining tool configured to provide a front-end processed wafer in accordance with the present disclosure. In an example embodiment, the front-end process tool 702 is a wire saw. In other embodiments, the front-end process tool 702 may be a grinding tool, a lapping tool, a beveling tool, or an etching tool.

The flatness inspection tool 704 is a wafer geometry measurement tool configured to obtain measurement data from a front-end processed wafer. For example, flatness inspection tool 704 may obtain measurement data by scanning a surface of a front-end processed wafer (e.g., by scanned diameter lines shown in FIGS. 3 and 4 or spiral scan shown in FIG. 5 on the wafer 300) using a capacitance probe or interferometer. The measurement data obtained by scanning one or both surfaces of the wafer includes surface profile data and thickness profile data of the wafer. In one example, the flatness inspection tool 704 is a Kobelco SBW-330 tool. The flatness inspection tool 704 may have the same functionality as the geometry measurement tool discussed in detail above with respect to FIGS. 3-5. In another example, the flatness inspection tool 704 obtains measurement data of the edge profile of the wafer. In this example, the flatness inspection tool 704 may be a commercial 3D microscope such as, for example, coherence scanning interferometric, confocal laser scanning, or laser scanning microscopes suitable to obtain edge profile data of the wafer.

Computing device 706 includes a processor 708 for executing instructions. In some embodiments, executable instructions are stored in a memory area 710. The processor 708 may include one or more processing units (e.g., in a multi-core configuration). The memory area 710 is any device allowing information such as executable instructions and/or data to be stored and retrieved. The memory area 710 may include one or more computer readable storage devices or other computer readable media, including transitory and non-transitory computer readable media.

Computing device 706 also includes at least one media output component 712 for presenting information to a user (e.g., a wafer end user, quality control personnel, etc.). The media output component 712 is any component capable of conveying information to the user. In some embodiments, the media output component 712 includes an output adapter such as a video adapter and/or an audio adapter. An output adapter is operatively connected to the processor 708 and operatively connectable to an output device such as a display device (e.g., a liquid crystal display (LCD), organic light emitting diode (OLED) display, cathode ray tube (CRT), or "electronic ink" display) or an audio output device (e.g., a speaker or headphones). In some embodiments, at least one such display device and/or audio device is included in the media output component 712.

In some embodiments, computing device 706 includes an input device 714 for receiving input from the user. The input device 714 may include, for example, a keyboard, a pointing device, a mouse, a stylus, a touch sensitive panel (e.g., a touch pad or a touch screen), a gyroscope, an accelerometer, a position detector, or an audio input device. A single component such as a touch screen may function as both an output device of the media output component 712 and the input device 714.

Computing device 706 may also include a communication interface 716, which may be communicatively connected to one or more remote devices. The communication interface 716 may include, for example, a wired or wireless network adapter or a wireless data transceiver for use with a mobile phone network (e.g., Global System for Mobile communications (GSM), 3G, 4G or Bluetooth) or other mobile data network (e.g., Worldwide Interoperability for Microwave Access (WIMAX)).

Stored in the memory area 710 are, for example, processor-executable instructions for receiving and processing input from flatness inspection tool 704 and modifying front-end process tool 702 based on the processed input received from flatness inspection tool 704. For example, the memory area 710 may store instructions that cause the processor 708 to perform the process 400 shown in FIG. 8, the process 500 shown in FIG. 14, and/or the process 600 shown in FIG. 23, each of which are described in detail above.

The memory area 710 may include, but is not limited to, any computer-operated hardware suitable for storing and/or retrieving processor-executable instructions and/or data. The memory area 710 may include random access memory (RAM) such as dynamic RAM (DRAM) or static RAM (SRAM), read-only memory (ROM), erasable programmable read-only memory (EPROM), electrically erasable programmable read-only memory (EEPROM), and nonvolatile RAM (NVRAM). Further, the memory area 710 may include multiple storage units such as hard disks or solid state disks in a redundant array of inexpensive disks (RAID) configuration. The memory area 710 may include a storage area network (SAN) and/or a network attached storage (NAS) system. In some embodiments, the memory area 710 includes memory that is integrated in computing device 706. For example, computing device 706 may include one or more hard disk drives as the memory area 710. The memory area 710 may also include memory that is external to computing device 706 and may be accessed by a plurality of computing devices. The above memory types are exemplary only, and are thus not limiting as to the types of memory usable for storage of processor-executable instructions and/or data.

When introducing elements of the present invention or the embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above constructions and methods without departing from the scope of the invention, it is intended that all matter contained in the above description and shown in the accompanying drawings shall be interpreted as illustrative and not in a limiting sense.

What is claimed is:

1. A method for processing semiconductor wafers, the method comprising:
   providing a first semiconductor wafer processed by a front-end process tool;
   obtaining measurement data from scan lines along a surface of the first semiconductor wafer, the measurement data of each scan line including a thickness profile and a surface profile;
   determining a center plane of the wafer based on the measurement data of the scan lines;
   generating, for each scan line, a raw shape profile based on the measurement data of the scan line and the center plane of the wafer;
   generating, for each scan line, an ideal shape profile based on polynomial regression of the raw shape profile;
   generating, for each scan line, a Gapi profile based on the raw shape profile and the ideal shape profile;
   calculating a Gapi value of the first semiconductor wafer based on the Gapi profiles of the scan lines;
   determining whether the Gapi value of the first semiconductor wafer is within a predetermined threshold;
   if the Gapi value of the first semiconductor wafer is not within the predetermined threshold:
      tuning the front-end process tool based on at least one of the Gapi profiles of the scan lines of the first semiconductor wafer; and
      processing a second semiconductor wafer with the tuned front-end process tool; and
   if the Gapi value of the first semiconductor wafer is within the predetermined threshold, sorting the first semiconductor wafer for polishing.

2. The method of claim 1, wherein the determining the center plane of the wafer is based on regression analysis of the measurement data of the scan lines.

3. The method of claim 2, wherein the regression analysis includes least squares fitting.

4. The method of claim 1, wherein the raw shape profile of each scan line is smoothed by moving average before generating the ideal shape profile of each scan line.

5. The method of claim 1, wherein the generating the ideal shape profile of each scan line is based on second-order polynomial regression of the raw shape profile.

6. The method of claim 1, further comprising:
   generating, for each scan line, a delta shape profile by comparing the raw shape profile and the ideal shape profile; and
   generating, for each scan line, a weighting profile based on variations in the delta shape profile along a direction of the scan line;
   wherein the Gapi profile of each scan line is generated based on the delta shape profile and the weighting profile.

7. The method of claim 6, wherein the weighting profile is generated based on at least one of a shape variation and a slope change of the delta shape profile, each of the shape variation and the slope change being determined within defined moving windows along the direction of the scan line.

8. The method of claim 1, wherein the front-end process tool is selected from the group consisting of a wire saw, a lapping tool, and a grinding tool.

9. The method of claim 1, wherein the Gapi value of the first semiconductor wafer is calculated based on a root-mean-square value of the Gapi profiles.

10. The method of claim 9, wherein the predetermined threshold for the Gapi root-mean-square value is less than or equal to 6.

11. The method of claim 1, wherein the second semiconductor wafer is the same wafer as the first semiconductor wafer.

12. A system for processing semiconductor wafers, the system comprising:
   a front-end process tool for front-end processing of a semiconductor wafer;
   a flatness inspection tool for obtaining measurement data from scan lines along a surface of the front-end processed wafer, the measurement data of each scan line including a thickness profile and a surface profile; and
   a computing device connected to the flatness inspection tool and the front-end process tool, the computing device configured to:
      receive the measurement data of the scan lines from the flatness inspection tool;
      determine a center plane of the wafer based on the measurement data of the scan lines;
      generate, for each scan line, a raw shape profile based on the measurement data of the scan line and the center plane of the wafer;
      generate, for each scan line, an ideal shape profile based on polynomial regression of the raw shape profile;

generate, for each scan line, a Gapi profile based on the raw shape profile and the ideal shape profile;

calculate a Gapi value of the front-end processed wafer based on the Gapi profiles of the scan lines;

determine whether the Gapi value of the front-end processed wafer is within a predetermined threshold; and if the Gapi value of the front-end processed wafer is not within the predetermined threshold, modify the front-end process tool based on at least one of the Gapi profiles of the scan lines.

13. The system of claim 12, wherein the computing device is configured to determine the center plane of the wafer based on regression analysis of the measurement data of the scan lines.

14. The system of claim 13, wherein the regression analysis includes least squares fitting.

15. The system of claim 12, wherein the computing device is configured to smooth by moving average the raw shape profile of each scan line before generating the ideal shape profile of each scan line.

16. The system of claim 12, wherein the computing device is configured to generate the ideal shape profile of each scan line based on second-order polynomial regression of the raw shape profile.

17. The system of claim 12, wherein the computing device is further configured to:

generate, for each scan line, a delta shape profile by comparing the raw shape profile and the ideal shape profile; and generate, for each scan line, a weighting profile based on variations in the delta shape profile along a direction of the scan line;

wherein the Gapi profile of each scan line is generated based on the delta shape profile and the weighting profile.

18. The system of claim 12, wherein the front-end process tool is selected from the group consisting of a wire saw, a lapping tool, and a grinding tool.

19. The system of claim 12, wherein the computing device is further configured to calculate the Gapi value of the front-end processed wafer based on a root-mean-square value of the Gapi profiles.

20. The system of claim 19, wherein the predetermined threshold for the Gapi root-mean-square value is less than or equal to 6.

* * * * *

UNITED STATES PATENT AND TRADEMARK OFFICE
CERTIFICATE OF CORRECTION

| | |
|---|---|
| PATENT NO. | : 12,385,850 B2 |
| APPLICATION NO. | : 17/818123 |
| DATED | : August 12, 2025 |
| INVENTOR(S) | : Yung Hsing Chu et al. |

It is certified that error appears in the above-identified patent and that said Letters Patent is hereby corrected as shown below:

On the Title Page

Item (54) and in the Specification, Column 1, Line 1, in Title, delete "SEMICONDUCTOR WAFERS USING FRONT-END PROCESSED WAFER GLOBAL GEOMETRY METRICS" and insert therefor --SYSTEMS AND METHODS FOR PROCESSING SEMICONDUCTOR WAFERS USING FRONT-END PROCESSED WAFER GLOBAL GEOMETRY METRICS--.

Signed and Sealed this
Third Day of February, 2026

John A. Squires
*Director of the United States Patent and Trademark Office*